United States Patent
Edwards et al.

(10) Patent No.: US 9,754,929 B2
(45) Date of Patent: Sep. 5, 2017

(54) POSITIVE STRIKE SCR, NEGATIVE STRIKE SCR, AND A BIDIRECTIONAL ESD STRUCTURE THAT UTILIZES THE POSITIVE STRIKE SCR AND THE NEGATIVE STRIKE SCR

(71) Applicant: Texas Instruments Incorporated, Dallas, TX (US)

(72) Inventors: Henry Litzmann Edwards, Garland, TX (US); Akram A. Salman, Plano, TX (US); Md Iqbal Mahmud, Hillsboro, OR (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/311,205

(22) Filed: Jun. 20, 2014

(65) Prior Publication Data
US 2015/0371985 A1   Dec. 24, 2015

(51) Int. Cl.
*H01L 21/8238* (2006.01)
*H01L 27/02* (2006.01)
*H01L 29/747* (2006.01)
*H01L 29/66* (2006.01)
*H01L 29/45* (2006.01)
*H01L 29/74* (2006.01)
*H01L 29/06* (2006.01)

(52) U.S. Cl.
CPC ........ *H01L 27/0262* (2013.01); *H01L 29/456* (2013.01); *H01L 29/66386* (2013.01); *H01L 29/747* (2013.01); *H01L 29/0619* (2013.01); *H01L 29/0649* (2013.01); *H01L 29/0692* (2013.01); *H01L 29/7436* (2013.01)

(58) Field of Classification Search
CPC .................................... H01L 27/0262
USPC ........................................ 438/230
See application file for complete search history.

(56) References Cited

U.S. PATENT DOCUMENTS

| | | | | |
|---|---|---|---|---|
| 6,610,262 B1 * | 8/2003 | Peng | ................... | H01L 27/0262 257/355 |
| 8,890,248 B2 * | 11/2014 | Pauletti | ............... | H01L 27/0262 257/173 |
| 9,171,833 B2 * | 10/2015 | Vinson | ................ | H01L 27/0262 |
| 9,275,991 B2 * | 3/2016 | Salcedo | ............. | H01L 27/0921 |
| 2009/0166721 A1 * | 7/2009 | Denison | .............. | H01L 27/0262 257/328 |
| 2010/0171149 A1 * | 7/2010 | Denison | .............. | H01L 29/7436 257/173 |
| 2013/0187218 A1 * | 7/2013 | Lai | ......................... | H01L 27/027 257/328 |
| 2013/0285113 A1 | 10/2013 | Edwards et al. | | |
| 2014/0054642 A1 | 2/2014 | Edwards et al. | | |

(Continued)

*Primary Examiner* — Jamie C Niesz
(74) *Attorney, Agent, or Firm* — Tuenlap D. Chan; Charles A. Brill; Frank D. Cimino

(57) ABSTRACT

A first silicon controlled rectifier has a breakdown voltage in a first direction and a breakdown voltage in a second direction. A second silicon controlled rectifier has a breakdown voltage with a higher magnitude than the first silicon controlled rectifier in the first direction, and a breakdown voltage with a lower magnitude than the first silicon controlled rectifier in the second direction. A bidirectional electrostatic discharge (ESD) structure utilizes both the first silicon controlled rectifier and the second silicon controlled rectifier to provide bidirectional protection.

5 Claims, 30 Drawing Sheets

(56) References Cited

U.S. PATENT DOCUMENTS

2014/0225156 A1\* 8/2014 Zhan ................ H01L 29/66325
   257/164
2014/0225228 A1\* 8/2014 Salcedo ............. H01L 27/0921
   257/575

\* cited by examiner

POSITIVE STRIKE SCR, NEGATIVE STRIKE SCR, AND A BIDIRECTIONAL ESD STRUCTURE THAT UTILIZES THE POSITIVE STRIKE SCR AND THE NEGATIVE STRIKE SCR

BACKGROUND OF THE INVENTION

1. Field of the Invention

The present invention relates to a silicon controlled rectifier (SCR) and an electrostatic discharge (ESD) structure and, more particularly, to a positive strike SCR, a negative strike SCR, and a bidirectional ESD structure that utilizes both the positive strike SCR and the negative strike SCR.

2. Description of the Related Art

A silicon-controlled rectifier (SCR) is a device that provides an open circuit between a first node and a second node when the voltage across the first and second nodes is positive and less than a trigger voltage. When the voltage across the first and second nodes rises to be equal to or greater than the trigger voltage, the SCR provides a low-resistance current path between the first and second nodes. Further, once the low-resistance current path has been provided, the SCR maintains the current path as long as the voltage across the first and second nodes is greater than a holding voltage, which is lower than the trigger voltage.

As a result of these characteristics, SCRs have been used to provide electrostatic discharge (ESD) protection. For example, the first node of an ESD SCR can be connected to a to-be-protected node, while the second node of the ESD SCR can be connected to a ground node. The ESD SCR operates within an ESD protection window that has a maximum voltage that is less than the destructive breakdown level of the to-be-protected node, and a minimum voltage that is greater than the holding voltage. The trigger voltage of the ESD SCR is then set to a value that is equal to or less than the maximum voltage of the window.

Thus, when the voltage across the to-be-protected node and the ground node is less than the trigger voltage, the ESD SCR provides an open circuit between the to-be-protected node and the ground node. However, when the to-be-protected node receives a voltage spike that equals or exceeds the trigger voltage, such as when an ungrounded human-body contact occurs, the ESD SCR provides a low-resistance current path from the to-be-protected node to the ground node. In addition, once the ESD event has passed and the current through the ESD SCR falls below a holding current of the ESD SCR, the ESD SCR again provides an open circuit between the to-be-protected node and the ground node.

SUMMARY OF THE INVENTION

The present invention provides a silicon controlled rectifier (SCR) with a high-magnitude breakdown voltage. A SCR of the present invention includes a first well and a second well. The first well has a first conductivity type and a dopant concentration, the second well has the first conductivity type and a dopant concentration substantially equal to the dopant concentration of the first well. The first and second wells are spaced apart. The SCR also includes a deep region that has a second conductivity type and a dopant concentration. The deep region touches and lies between the first and second wells. The SCR further includes a first contact region that has the first conductivity type and a dopant concentration that is greater than the dopant concentration of the first well. The first contact region touches the first well. In addition, the SCR includes a first source region and a second source region. The first source region has the second conductivity type and a dopant concentration that is greater than the dopant concentration of the deep region. The first source region touches the first contact region. The second source region has the second conductivity type and a dopant concentration substantially equal to the dopant concentration of the first source region. The second source region touches the second well. Further, the SCR includes a second contact region that has the first conductivity type and a dopant concentration substantially equal to the dopant concentration of the first contact region. The second contact region touches the second source region. The first contact region lies horizontally between the first and second source regions. The second source region lies horizontally between the first and second contact regions.

The present invention also provides an electrostatic discharge (ESD) structure that provides bidirectional protection. The ESD structure includes a first well and a second well. The first well has a first conductivity type and a dopant concentration, the second well has the first conductivity type and a dopant concentration substantially equal to the dopant concentration of the first well. The first and second wells are spaced apart. The ESD structure also includes a deep region that has a second conductivity type and a dopant concentration. The deep region touches and lies between the first and second wells. The ESD structure further includes a positive strike structure that touches the first well. The positive strike structure includes a first contact region and a first source region. The first contact region has the first conductivity type and a dopant concentration that is greater than the dopant concentration of the first well. The first contact region touches the first well. The first source region has the second conductivity type and a dopant concentration that is greater than the dopant concentration of the deep region. The first source region touches the first contact region. In addition, the ESD structure includes a first common structure that touches the second well. The first common structure includes a second source region and a second contact region. The second source region has the second conductivity type and a dopant concentration substantially equal to the dopant concentration of the first source region. The second source region touches the second well. The second contact region has the first conductivity type and a dopant concentration substantially equal to the dopant concentration of the first contact region. The second contact region touches the second source region. The first contact region lies horizontally between the first and second source regions. The second source region lies horizontally between the first and second contact regions. Further, the ESD structure includes a negative strike structure that touches the first well. The negative strike structure includes a third source region and a third contact region. The third source region has the second conductivity type and a dopant concentration substantially equal to the dopant concentration of the first source region. The third source region touches the first well and is spaced apart from the first and second source regions. The third contact region has the first conductivity type and a dopant concentration substantially equal to the dopant concentration of the first contact region. The third contact region touches the third source region and is spaced apart from the first and second contact regions.

The present invention also provides a method of forming an electrostatic discharge (ESD) structure that provides bidirectional protection. The method includes forming first and second wells in a semiconductor material. The first and second wells each has a first conductivity type and a dopant concentration. The first and second wells each touches a deep region, the deep region has a second conductivity type, and touches and lies between the first and second wells. The method also includes forming first and second source regions in the semiconductor material. The first and second source regions each has the second conductivity type and a dopant concentration that is greater than the dopant concentration of the deep region. The first and second source regions lie spaced apart from each other. The second source region touches the second well. In addition, the method includes forming first and second contact regions in the semiconductor material. The first and second contact regions each has the first conductivity type and a dopant concentration that is greater than the dopant concentration of the first well. The first and second contact regions lie spaced apart from each other. The first contact region touches the first well and the first source region. The second contact region touches the second source region. The first contact region lies horizontally between the first and second source regions. The second source region lies horizontally between the first and second contact regions.

A better understanding of the features and advantages of the present invention will be obtained by reference to the following detailed description and accompanying drawings which set forth an illustrative embodiment in which the principals of the invention are utilized.

BRIEF DESCRIPTION OF THE DRAWINGS

FIGS. 5A-17A are plan views. FIGS. 5B-17B are cross-sectional views taken along lines 5B-5B through 17B-17B in FIGS. 5A-17A, respectively. FIGS. 5C-17C are cross-sectional views taken along lines 5C-5C through 17C-17C in FIGS. 5A-17A, respectively.

FIG. 18A is a cross-sectional view taken along line 18A-18A in FIG. 17A. FIG. 18B is a cross-sectional view taken along line 18B-18B in FIG. 17A.

DETAILED DESCRIPTION OF THE INVENTION

Figure 1:
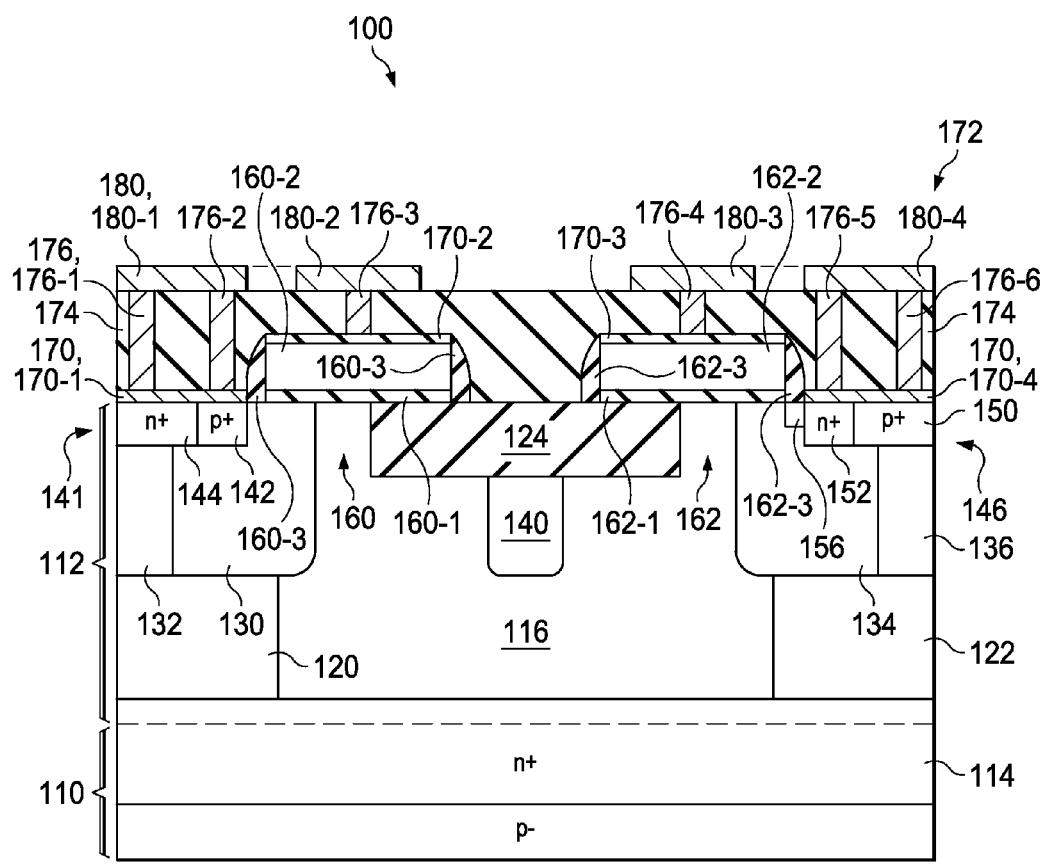
FIG. 1 is a cross-sectional view illustrating an example of a positive strike silicon controlled rectifier (SCR) 100 in accordance with the present invention.

FIG. 1 shows a cross-sectional view that illustrates an example of a positive strike silicon controlled rectifier (SCR) 100 in accordance with the present invention. As described in greater detail below, SCR 100 has a breakdown voltage in a first direction and a breakdown voltage in a second direction, and is used with a second SCR to implement a bidirectional electrostatic discharge (ESD) structure. The second SCR has a breakdown voltage with a higher magnitude than SCR 100 in the first direction, and a breakdown voltage with a lower magnitude than SCR 100 in the second direction.

As shown in FIG. 1, SCR 100 includes a conventionally-formed p-type substrate 110, and a p-type epitaxial layer 112 that touches and lies above p-type substrate 110. For example, p-type substrate 110 can be implemented with a p+ bulk wafer and a p− epitaxial layer that is formed on top of the p+ bulk wafer.

As further shown in FIG. 1, SCR 100 includes an n+ buried region 114 and a deep n-type region 116. N+ buried region 114 extends down from the top surface of substrate 110 into substrate 110 and, to a much lesser extent, up from the bottom surface of p-type epitaxial layer 112 into p-type epitaxial layer 112. Deep n-type region 116, in turn, extends down from the top surface of p-type epitaxial layer 112 through p-type epitaxial layer 112 to touch n+ buried region 114.

SCR 100 also includes a first native p-type region 120 and a second native p-type region 122 that both touch deep n-type region 116. The first and second native p-type regions 120 and 122 are original spaced-apart p-type regions of p-type epitaxial layer 112, and have substantially equal dopant concentrations. SCR 100 further includes a shallow trench isolation (STI) region 124 that extends down from the top surface of p-type epitaxial layer 112 and touches deep n-type region 116.

In addition, SCR 100 includes a first shallow p-type well 130 and a first p-type diffused region 132. First shallow p-type well 130 touches deep n-type region 116 and first native p-type region 120. First p-type diffused region 132 touches first native p-type region 120, and touches and extends along only one lengthwise sidewall of first shallow p-type well 130.

First p-type diffused region 132 has a dopant concentration that is greater than the dopant concentration of first native p-type region 120, and less than the dopant concentration of first shallow p-type well 130. As a result, first shallow p-type well 130 has a dopant concentration that is greater than the dopant concentration of first native p-type region 120. (First p-type diffused region 132 can optionally be omitted such that first shallow p-type well 130 also occupies that space.)

SCR 100 further includes a second shallow p-type well 134 and a second p-type diffused region 136. Second shallow p-type well 134 touches deep n-type region 116 and second native p-type region 122. Deep n-type region 116 touches and lies between the first and second shallow p-type wells 130 and 134. Second shallow p-type well 134 has a dopant concentration that is substantially equal to the dopant concentration of first shallow p-type well 130.

Second p-type diffused region 136 touches second native p− region 122, and touches and extends along only one lengthwise sidewall of second shallow p-type well 134. Second p-type diffused region 136 has a dopant concentration that is substantially equal to the dopant concentration of first p-type diffused region 132. Second native p-type region 122 has a dopant concentration that is substantially equal to the dopant concentration of first native p-type region 120.

SCR 100 additionally includes a shallow n-type drain region 140 that touches deep n-type region 116 and lies horizontally between, and spaced apart from, the first and second shallow p-type wells 130 and 134. Further, shallow n-type drain region 140 lies horizontally closer to second shallow p-type well 134 than to first shallow p-type well 130. Shallow n-type drain region 140 has a dopant concentration that is greater than the dopant concentration of deep n-type region 116.

SCR 100 also has a positive strike structure 141 that includes a first p+ contact region 142 and a first n+ source region 144. First p+ contact region 142 touches and lies horizontally between first shallow p-type well 130 and first n+ source region 144. First p+ contact region 142 also lies spaced apart from deep n-type region 116 and first p-type diffused region 132. First p+ contact region 142 has a dopant concentration that is greater than the dopant concentration of first shallow p-type well 130. In addition, first shallow p-type well 130 lies horizontally closer to STI region 124 than second shallow p-type well 134 as a result of first p+ contact region 142.

First n+ source region 144 touches first shallow p-type well 130, first p-type diffused region 132, and first p+ contact region 142, and lies spaced apart from deep n-type region 116 and first native p-type region 120. First n+ source region 144 has a dopant concentration that is greater than the dopant concentration of deep n-type region 116. Further, first shallow p-type well 130 lies horizontally between deep n-type region 116 and first p+ contact region 142.

As further shown in FIG. 1, SCR 100 has a common structure 146 that includes a second p+ contact region 150 and a second n+ source region 152. Second p+ contact region 150 touches second p-type diffused region 136, and lies spaced apart from deep n-type region 116 and second native p-type region 122. Second p+ contact region 150 has a dopant concentration substantially equal to the dopant concentration of first p+ contact region 142.

Second n+ source region 152 touches and lies horizontally between second shallow p-type well 134 and second p+ contact region 150. Second n+ source region 152 also lies spaced apart from deep n-type region 116 and second native p-type region 122. Second n+ source region 152 has a dopant concentration substantially equal to the dopant concentration of first n+ source region 152.

Further, first p+ contact region 142 lies horizontally between the first and second n+ source regions 144 and 152. In addition, second n+ source region 152 lies horizontally between the first and second p+ contact regions 142 and 150. SCR 100 also optionally includes a lightly-doped n-type (LDD type) region 156 that touches and lies adjacent to n+ source region 152.

SCR 100 further includes a first gate structure 160 and a second gate structure 162. First gate structure 160, which touches and lies over p-type epitaxial layer 112, has a gate dielectric layer 160-1 that touches and lies over deep n-type region 116 and first shallow p-type well 130, a gate 160-2 that touches and lies over gate dielectric layer 160-1, and a nonconductive side wall spacer 160-3 that laterally surrounds gate 160-2. (Side wall spacer 160-3 can optionally be omitted.) Gate 160-2 also lies over STI region 124.

Second gate structure 162, which touches and lies over p-type epitaxial layer 112, has a gate dielectric layer 162-1 that touches and lies over deep n-type region 116 and second shallow p-type well 134, a gate 162-2 that touches and lies over gate dielectric layer 162-1, and a nonconductive side wall spacer 162-3 that laterally surrounds gate 162-2. (Side wall spacer 162-3 can optionally be omitted.) Gate 162-2 also lies over STI region 124.

In addition, SCR 100 includes a number of metal silicide structures 170. The metal silicide structures 170 include a first metal silicide structure 170-1 that touches first p+ contact region 142 and first n+ source region 150, and a second metal silicide structure 170-2 that touches gate 160-2. The metal silicide structures 170 also include a third metal silicide structure 170-3 that touches gate 162-2, and a fourth metal silicide structure 170-4 that touches second p+ contact region 150 and second n+ source region 152.

Further, SCR 100 includes a metal interconnect structure 172 that is electrically connected to first p+ contact region 142, second p+ contact region 150, first n+ source region 144, second n+ source region 152, gate 160-2, and gate 162-2. Metal interconnect structure 172 includes a first dielectric layer 174, and a number of metal contacts 176 that touch and extend through first dielectric layer 174.

The metal contacts 176 include a first metal contact 176-1 that touches first metal silicide layer 170-1 to make an electrical connection with first n+ source region 144, and a second metal contact 176-2 that touches first metal silicide layer 170-1 to make an electrical connection with first p+ contact region 142.

The metal contacts 176 also include a third metal contact 176-3 that touches second metal silicide layer 170-2 to make an electrical connection with gate 160-2, and a fourth metal contact 176-4 that touches third metal silicide layer 170-3 to make an electrical connection with gate 162-2.

The metal contacts 176 further include a fifth metal contact 176-5 that touches fourth metal silicide layer 170-4 to make an electrical connection with second n+ source region 152, and a sixth metal contact 176-6 that touches fourth metal silicide layer 170-4 to make an electrical connection with second p+ contact region 150.

Metal interconnect structure 172 also includes a number of metal traces 180 that are electrically connected to the metal contacts 176. The metal traces 180 include a first metal trace 180-1 that touches first metal contact 176-1 and second metal contact 176-2, and a second metal trace 180-2 that touches third metal contact 176-3. Optionally, the first metal trace 180-1 and the second metal trace 180-2 can be a single metal trace, as illustrated by the dashed lines, to electrically connect gate 160-2 to n+ source region 144.

The metal traces 180 also include a third metal trace 180-3 that touches fourth metal contact 176-4, and a fourth metal trace 180-4 that touches fifth metal contact 176-5 and sixth metal contact 176-6. Optionally, the third metal trace 180-3 and the fourth metal trace 180-4 can be a single metal trace, as illustrated by the dashed lines, to electrically connect gate 162-2 to n+ source region 152.

Metal interconnect structure 172 also includes additional layers of vias and metal traces which are not shown for simplicity. (Gate 160-2 can also be electrically connected to n+ source region 144 by way of a higher metal layer. Similarly, gate 162-2 can be electrically connected to n+ source region 152 by way of a higher metal layer.)

In operation, during a +ESD event, the voltage on metal trace 180-1, first n+ source region 144, first p+ contact region 142, and first shallow p-type well 130 rises quickly, which forward biases the pn junction between first shallow p-type well 130 and deep n-type region 116. The forward biased junction causes holes to be injected into deep n-type region 116 from first shallow p-type well 130, and electrons to be injected into first shallow p-type well 130 from deep n-type region 116. As a result, the forward bias causes the voltage on deep n-type region 116 to rise and follow the rising voltage on first shallow p-type well 130, following approximately 0.7V behind the rising voltage on first shallow p-type well 130.

The rising voltage on deep n-type region 116 reverse biases the pn junction between second shallow p-type well 134 and deep n-type region 116. When the magnitude of the rising voltage on deep n-type region 116 exceeds the magnitude of the breakdown voltage of the pn junction, avalanche multiplication causes large numbers of holes to be injected into second native p-type region 122, second p-type well 134, and second diffused p-type region 136 from deep n-type region 116, and large numbers of electrons to be injected into deep n-type region 116 from second native p-type region 122, second p-type well 134, and second diffused p-type region 136.

The magnitude of the breakdown voltage is partially controlled by the horizontal distance that lies between second p-type well 134 and shallow n-type drain region 140. As a result, changes in the horizontal distance cause the magnitude of the breakdown voltage to change. This is because the neighboring deep n-type region 116 quickly becomes depleted such that the pn junction is effectively defined by the position of shallow n-type drain region 140.

Thus, the holes injected into deep n-type region 116 from first p-type well 130 across the forward-biased junction are then injected into second native p-type region 122, second p-type well 134, and second diffused p-type region 136 from deep n-type region 116 across the reverse biased junction to flow to second p+ contact region 150. The electrons injected into deep n-type region 116 from second native p-type region 122, second p-type well 134, and second diffused p-type region 136 across the reverse biased junction are then injected into first shallow p-type well 130 from deep n-type region 116 across the forward biased junction.

In addition, second diffused p-type region 136 has a higher resistance than second shallow p-type well 130. As a result, the higher resistance of second diffused p-type region 136 causes a local voltage in second shallow p-type well 130 to increase and forward bias the pn junction between second shallow p-type well 134 and second n+ source region 152.

Forward biasing this pn junction causes holes to be injected into second n+ source region 152 from second shallow p-type well 134, and electrons to be injected into second shallow p-type well 134 from second n+ source region 152. The increased number of electrons flowing into second shallow p-type well 134 increases the number of electrons that are injected into deep n-type region 116.

Thus, one of the advantages of SCR 100 is that SCR 100 utilizes lightly-doped, high-resistance p-type diffusion region 136 to raise the local voltage and forward bias the pn junction between second shallow p-type well 134 and second n+ source region 152. Forward biasing this pn junction substantially increases the magnitude of the hole and electron flow, thereby providing increased ESD protection.

Another advantage of SCR 100 is that SCR 100 utilizes a wider first shallow p-type well 130 along with p+ contact region 142 to reduce the resistance of this p-type region, which functions as the emitter of a PNP bipolar transistor that also includes deep n-type region 116 as the base and second shallow p-type well 134/second diffused p-type region 136 as the collector. (First shallow p-type well 130 is wider than second shallow p-type well 134 because first shallow p-type well 130 lies closer to STI region 124 than second shallow p-type well 134.) The width of first shallow p-type well 130 can be wider than the width of second shallow p-type well 134 because p+ contact region 142 substantially eliminates any concern about short channel effects such as punch through.

Figure 2:
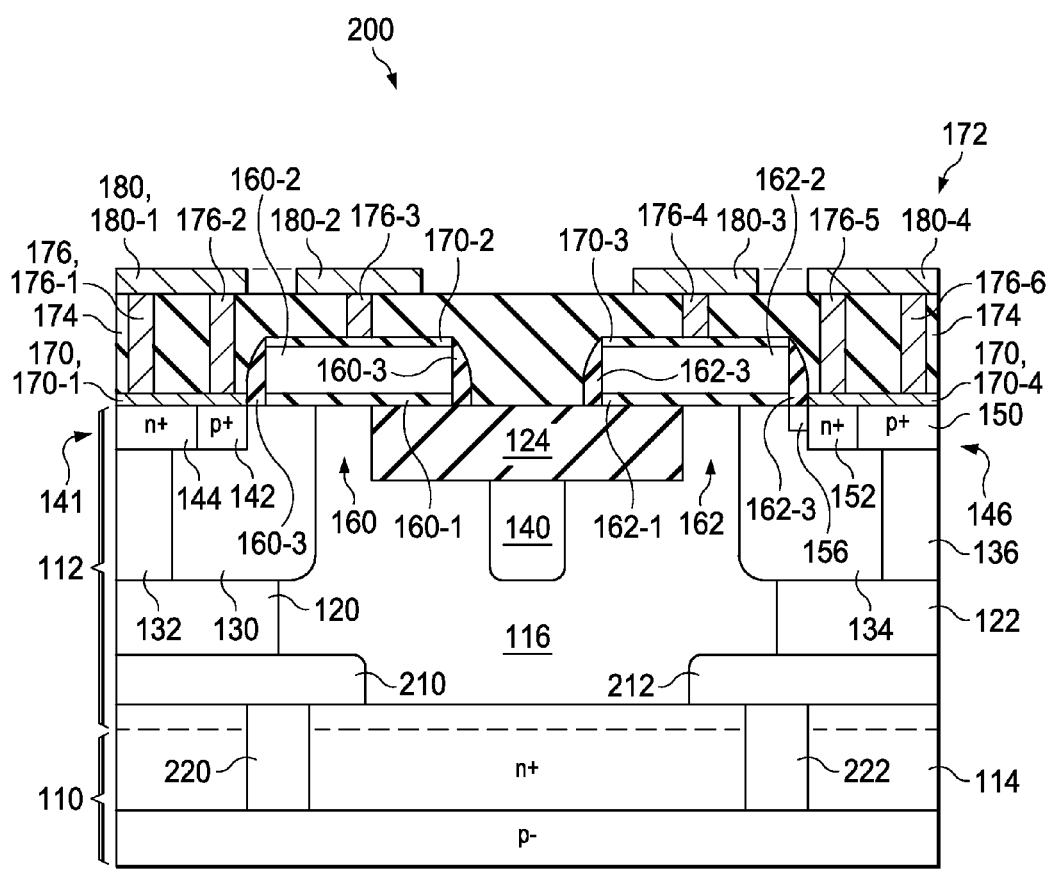
FIG. 2 is a cross-sectional view illustrating an example of a positive strike silicon controlled rectifier (SCR) 200 in accordance with an alternate embodiment of the present invention.

FIG. 2 shows a cross-sectional view that illustrates an example of a positive strike silicon controlled rectifier (SCR) 200 in accordance with an alternate embodiment of the present invention. SCR 200 is similar to SCR 100 and, as a result, utilizes the same reference numerals to designate the structures which are common to both SCR 100 and SCR 200.

As shown in FIG. 2, SCR 200 differs from SCR 100 in that SCR 200 includes a first p+ buried layer 210 that touches n+ buried layer 114, touches and lies below first native p-type region 120, and lies directly below first shallow p-type well 130. SCR 200 additionally differs from SCR 100 in that SCR 200 also includes a second p+ buried layer 212 that touches n+ buried layer 114, touches and lies below second native p-type region 122, and lies directly below second shallow p-type well 134. The first and second p+ buried layers 210 and 212 are spaced apart from each other.

SCR 200 operates the same as SCR 100 except that the first and second p+ buried layers 210 and 212 increase the magnitude of the reverse bias breakdown voltage while at the same time maintaining a very low pre-breakdown leakage current. Thus, the first and second p+ buried layers 210 and 212 allow SCR 200 to operate where very high breakdown voltages are required (e.g., +90V).

Optionally, SCR 200 can also include a first lighter n-type buried region 220 and a second lighter n-type buried region 222, which are regions of a lighter n-type dopant concentration. Buried regions 220 and 222, which also increase the magnitude of the reverse bias breakdown voltage, can be used in conjunction with the first and second p+ buried layers 210 and 212, or without the first and second p+ buried layers 210 and 212.

Figure 3:
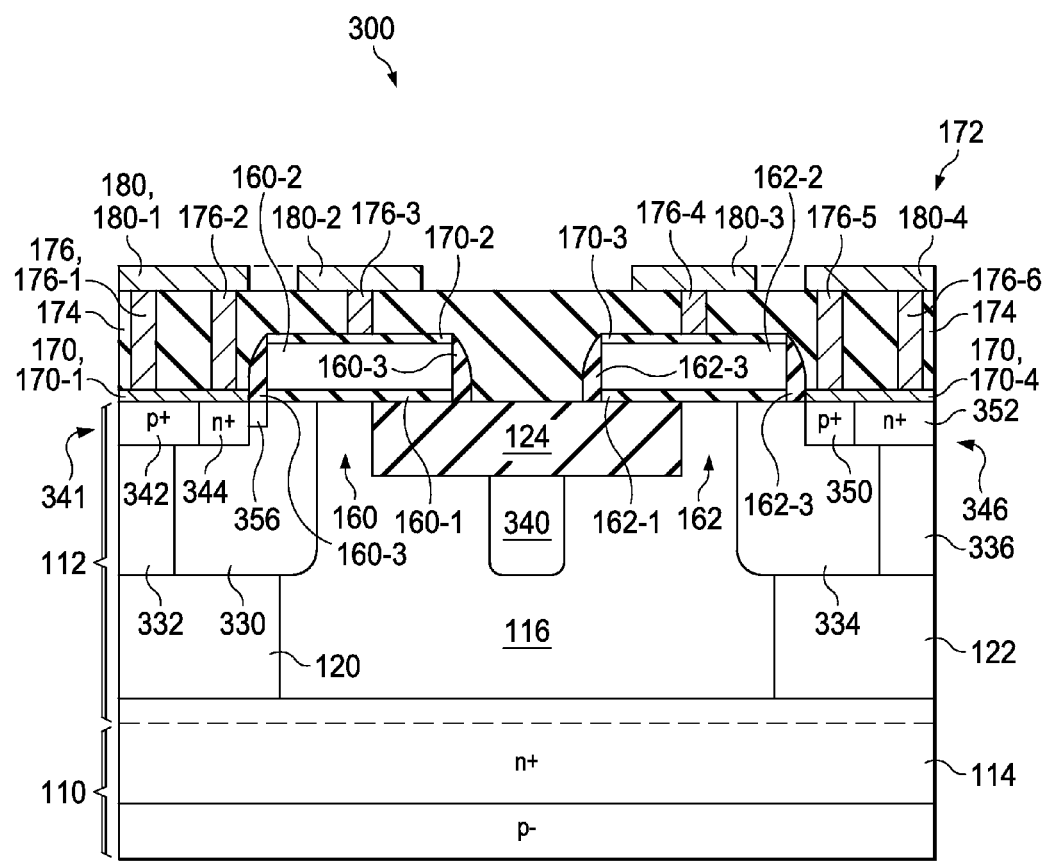
FIG. 3 is a cross-sectional view illustrating an example of a negative strike silicon controlled rectifier (SCR) 300 in accordance with an alternate embodiment of the present invention.

FIG. 3 shows a cross-sectional view that illustrates an example of a negative strike silicon controlled rectifier (SCR) 300 in accordance with an alternate embodiment of the present invention. SCR 300 is similar to SCR 100 and, as a result, utilizes the same reference numerals to designate the structures which are common to both SCR 100 and SCR 300.

As shown in FIG. 3, SCR 300 differs from SCR 100 in that SCR 300 utilizes a first shallow p-type well 330 in lieu of first shallow p-type well 130, and a first p-type diffused region 332 in lieu of first p-type diffused region 132. First shallow p-type well 330 differs from first shallow p-type well 130 in that first shallow p-type well 330 is narrower than first shallow p-type well 130.

First shallow p-type well 330 touches deep n-type region 116 and first native p-type region 120. First p-type diffused region 332 touches first native p-type region 120, and touches and extends along only one lengthwise sidewall of first shallow p-type well 330. First p-type diffused region 332 has a dopant concentration that is greater than the dopant concentration of first native p-type region 120, and less than the dopant concentration of first shallow p-type well 330.

As further shown in FIG. 3, SCR 300 differs from SCR 100 in that SCR 300 utilizes a second shallow p-type well 334 in lieu of second shallow p-type well 134, and a second p-type diffused region 336 in lieu of second p-type diffused region 136. Second shallow p-type well 334 differs from second shallow p-type well 134 in that second shallow p-type well 334 is wider than second shallow p-type well 134.

Second shallow p-type well 334 touches deep n-type well 116 and second native p-type region 122. Second p-type diffused region 336 touches second native p-type region 122, and touches and extends along only one lengthwise sidewall of second shallow p-type well 334. Second p-type diffused region 336 has a dopant concentration that is greater than the dopant concentration of second native p-type region 122, and less than the dopant concentration of second shallow p-type well 334. (Second p-type diffused region 336 can optionally be omitted such that second shallow p-type well 334 also occupies that space.)

In addition, SCR 300 differs from SCR 100 in that SCR 300 utilizes a shallow n-type drain region 340 in lieu of shallow n-type drain region 140. Shallow n-type drain region 340 touches deep n-type region 116 and lies horizontally between, and spaced apart from, the first and second shallow p-type wells 330 and 334. Shallow n-type drain region 340 differs from shallow n-type drain region 140 in that shallow n-type drain region 340 lies horizontally closer to first shallow p-type well 330 than to second shallow p-type well 334.

SCR 300 further differs from SCR 100 in that SCR 300 utilizes a negative strike structure 341 that includes a first p+ contact region 342 in lieu of first p+ contact region 142, and a first n+ source region 344 in lieu of first n+ source region 144. First p+ contact region 342 and first n+ source region 344 differ from first p+ contact region 142 and first n+ source region 144 in that the positions of the p+ contact region and n+ source region are reversed. First p+ contact region 342 touches first p-type diffused region 332, while first n+ source region 344 touches first shallow p-type well 330 and first p+ contact region 342. In addition, SCR 100 also optionally utilizes a lightly-doped n-type (LDD type) region 356 that touches and lies adjacent to n+ source region 344 in lieu of region 156.

SCR 300 additionally differs from SCR 100 in that SCR 300 utilizes a common structure 346 that includes a second p+ contact region 350 in lieu of second p+ contact region 150, and a second n+ source region 352 in lieu of second n+ source region 152. Second p+ contact region 350 and second n+ source region 352 differ from second p+ contact region 150 and second n+ source region 152 in that the positions of the p+ contact region and n+ source region are reversed.

Second p+ contact region 350 touches second shallow p-type well 334 and lies spaced apart from second p-type diffused region 336, while second n+ source region 352 touches second shallow p-type well 334, second diffused p-type region 336, and second p+ contact region 350. N+ source region 344 lies horizontally between the third and fourth p+ contact regions 342 and 350. The p+ contact region 350 lies horizontally between the third and fourth source regions 344 and 352.

In operation, during a −ESD event, the voltage on metal trace 180-1, first n+ source region 344, first p+ contact region 342, and first shallow p-type well 330 falls quickly, which reverse biases the pn junction between first shallow p-type well 330 and deep n-type region 116. When the magnitude of the falling voltage on first shallow p-type well 330 exceeds the magnitude of the breakdown voltage of the pn junction, avalanche multiplication causes large numbers of holes to be injected into first native p-type region 120, first shallow p-type well 330, and first p-type diffused region 332 from deep n-type region 116, and large numbers of electrons to be injected into deep n-type region 116 from first native p-type region 120, first shallow p-type well 330, and first p-type diffused region 332.

The magnitude of the breakdown voltage is partially controlled by the horizontal distance that lies between first shallow p-type well 330 and shallow n-type drain region 340. As a result, changes in the horizontal distance cause the magnitude of the breakdown voltage to change. This is because the neighboring deep n-type region 116 quickly becomes depleted such that the pn junction is effectively defined by the position of shallow n-type drain region 340.

The large number of electrons injected into deep n-type region 116 pulls the voltage on deep n-type region 116 down which, in turn, forward biases the pn junction between second shallow p-type well 334 and deep n-type region 116. The forward biased junction causes holes to be injected into deep n-type region 116 from second native p-type region 122, second shallow p-type well 334, and second p-type diffused region 336, and electrons to be injected into second native p-type region 122, second shallow p-type well 334, and second p-type diffused region 336 from deep n-type region 116. As a result, the forward bias causes the voltage on deep n-type region 116 to rise.

Thus, the holes injected into deep n-type region 116 from second p-type native region 122, second shallow p-type well 334, and second p-type diffused region 336 across the forward-biased junction are then injected into first native p-type region 120, first shallow p-type well 330, and first p-type diffused region 332 from deep n-type region 116. Some of the holes flow through first p-type diffused region 332 to first p+ contact region 342.

The electrons injected into deep n-type region 116 from first native p-type region 120, first p-type well 330, and first p-type diffused region 332 across the reverse biased junction are then injected into second p-type native region 122, second shallow p-type well 330, and second p-type diffused region 336 from deep n-type region 116 across the forward biased junction.

In addition, first diffused p-type region 332 has a higher resistance than first shallow p-type well 330. As a result, the higher resistance of first diffused p-type region 332 causes a local voltage in first shallow p-type well 330 to increase and forward bias the pn junction between first shallow p-type well 330 and first n+ source region 344.

Forward biasing this pn junction causes holes to be injected into first n+ source region 344 from first shallow p-type well 330, and electrons to be injected into first shallow p-type well 330 from first n+ source region 344. The increased number of holes flowing into first n+ source region 344 increases the number of holes that are injected into first shallow p-type well 330 from deep n-type region 116.

Thus, one of the advantages of SCR 300 is that SCR 300 utilizes high-resistance p-type region 332 to raise the local voltage and forward bias the pn junction between first shallow p-type well 330 and first n+ source region 344. Forward biasing this pn junction substantially increases the magnitude of the hole flow, thereby providing increased ESD protection.

Another advantage of SCR 300 is that SCR 300 utilizes wider second shallow p-type well 334 along with p+ contact region 350 to reduce the resistance of this p-type region, which functions as the collector of a PNP bipolar transistor that also includes deep n-type region 116 as the base and first shallow p-type well 330/first diffused p-type region 332 as the emitter. (Second shallow p-type well 334 is wider than first shallow p-type well 330 because second shallow p-type well 334 lies closer to STI region 124 than first shallow p-type well 330.) The width of second shallow p-type well 334 can be wider than the width of first shallow p-type well 330 because p+ contact region 350 substantially eliminates any concern about short channel effects such as punch through.

Figure 4:
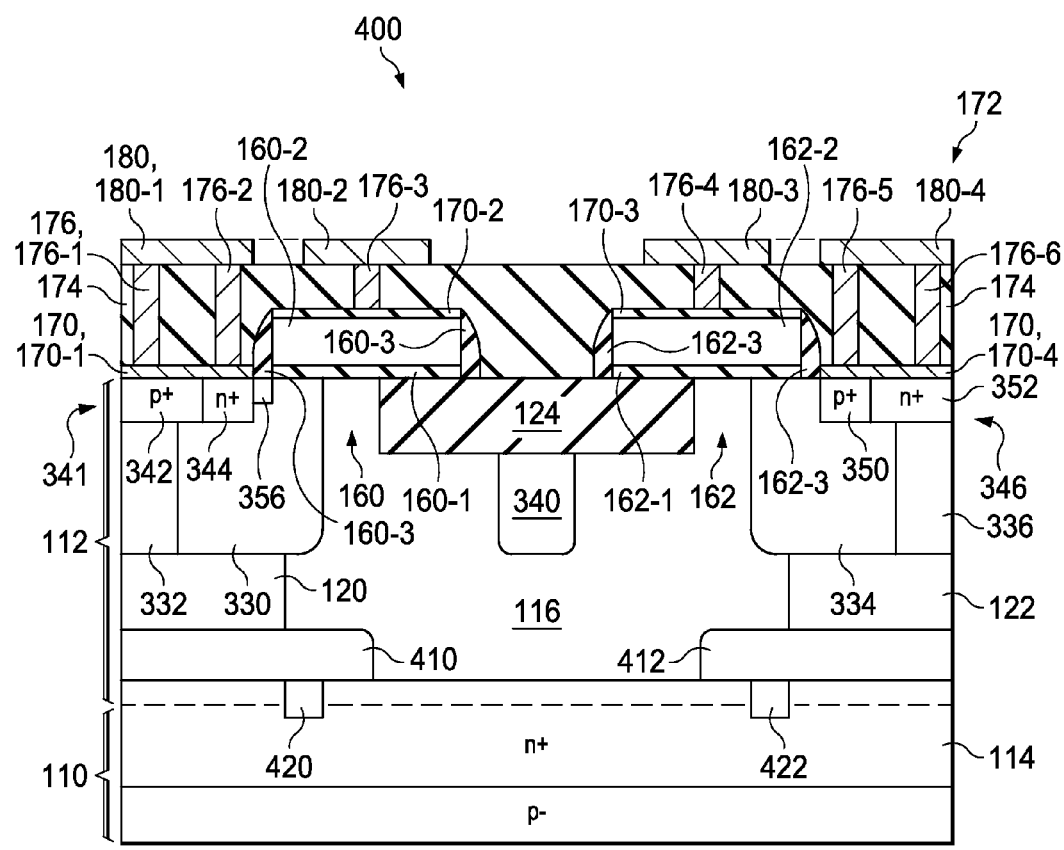
FIG. 4 is a cross-sectional view illustrating an example of a negative strike silicon controlled rectifier (SCR) 400 in accordance with an alternate embodiment of the present invention.

FIG. 4 shows a cross-sectional view that illustrates an example of a negative strike silicon controlled rectifier (SCR) 400 in accordance with an alternate embodiment of the present invention. SCR 400 is similar to SCR 300 and, as a result, utilizes the same reference numerals to designate the structures which are common to both SCR 300 and SCR 400.

As shown in FIG. 4, SCR 400 differs from SCR 300 in that SCR 400 includes a first p+ buried layer 410 that touches n+ buried layer 114, touches and lies below native p-type region 120, and lies directly below first shallow p-type well 330. SCR 400 additionally differs from SCR 300 in that SCR 400 also includes a second p+ buried layer 412 that touches n+ buried layer 116, touches and lies below native p-type region 122, and lies directly below second shallow p-type well 334. The first and second p+ buried layers 410 and 412 are spaced apart from each other.

SCR 400 operates the same as SCR 300 except that the first and second p+ buried layers 410 and 412 increase the magnitude of the reverse bias breakdown voltage while at the same time maintaining a very low pre-breakdown leakage current. Thus, the first and second p+ buried layers 410 and 412 allow SCR 400 to operate where very high breakdown voltages are required (e.g., −90V).

Optionally, SCR 400 can also include a first lighter n-type buried region 420 and a second lighter n-type buried region 422, which are regions of a lighter n-type dopant concentration. Buried regions 420 and 422, which also increase the magnitude of the reverse bias breakdown voltage, can be used in conjunction with the first and second p+ buried layers 410 and 412, or without the first and second p+ buried layers 410 and 412.

FIGS. 5A-5C through FIGS. 17A-17C show a series of views that illustrate a method 500 of fabricating a bidirectional electrostatic discharge (ESD) device in accordance with the present invention. FIGS. 5A-17A show plan views. FIGS. 5B-17B show cross-sectional views taken along lines 5B-5B through 17B-17B in FIGS. 5A-17A, respectively. FIGS. 5C-17C show cross-sectional views taken along lines 5C-5C through 17C-17C in FIGS. 5A-17A, respectively.

Figure 5A:
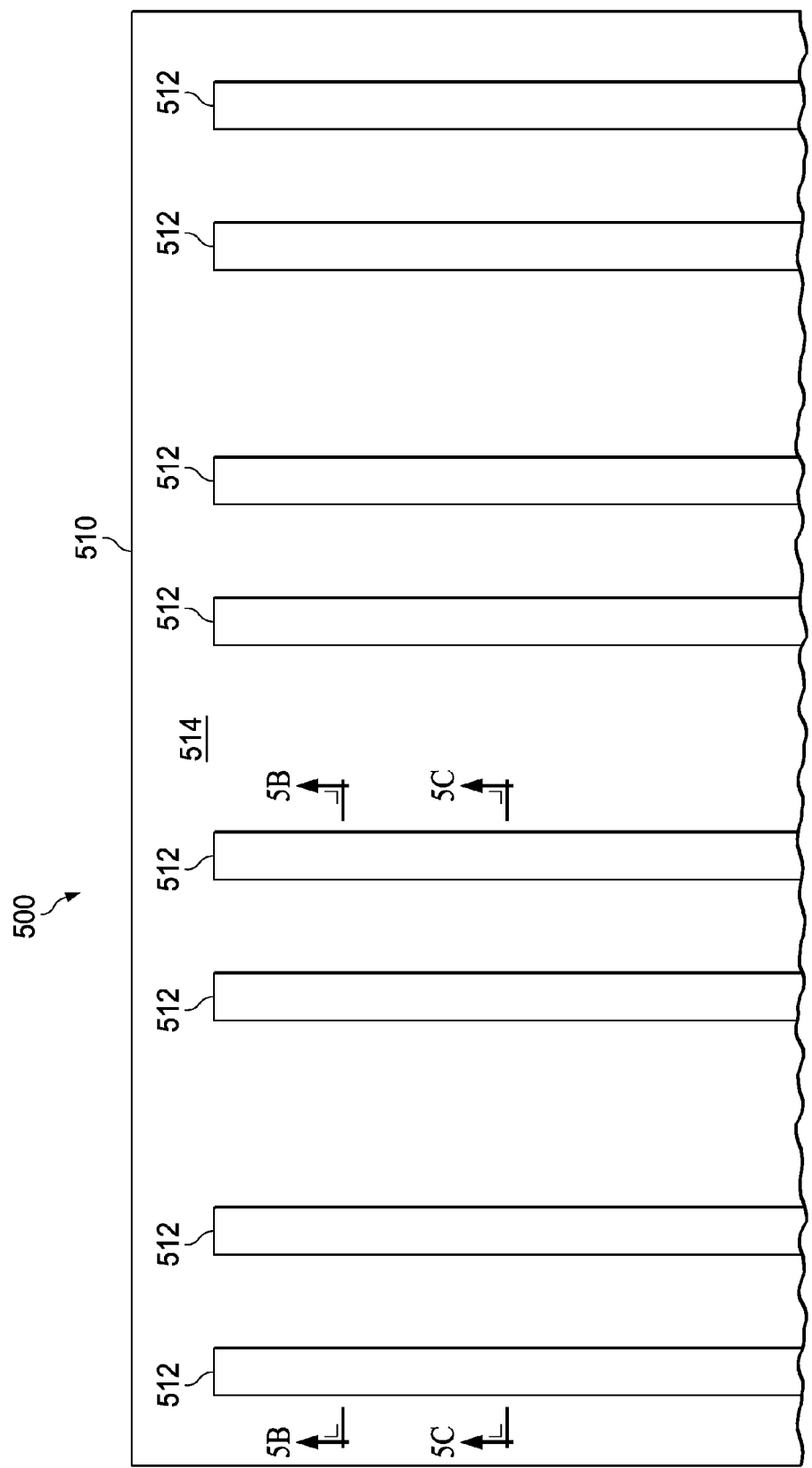
FIGS. 5A-5C through FIGS. 17A-17C are a series of views illustrating a method 500 of fabricating a bidirectional electrostatic discharge (ESD) device in accordance with the present invention.
Figure 5B:
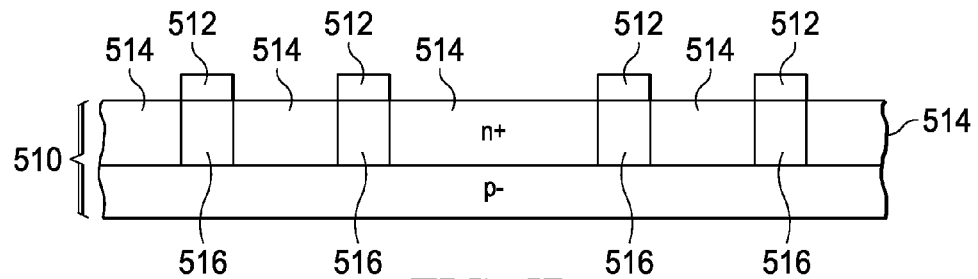
Figure 5C:
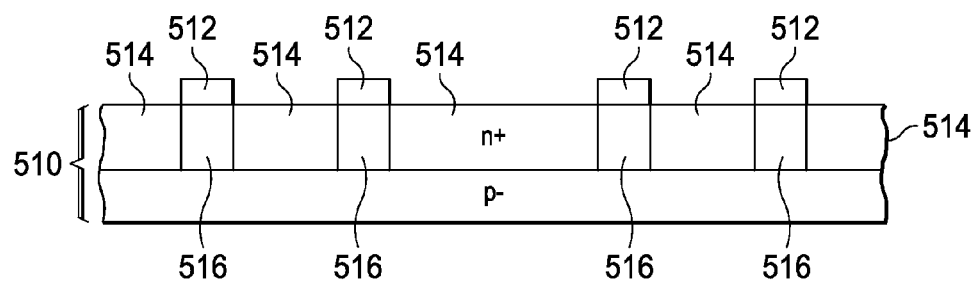

As shown in FIGS. 5A-5C, method 500 utilizes a conventionally-formed p-type semiconductor substrate 510. For example, p-type semiconductor substrate 510 can be implemented with a p+ bulk wafer and a p− epitaxial layer that has been formed on top surface of the p+ bulk wafer.

As further shown in FIGS. 5A-5C, method 500 begins by forming a hard mask 512 on the top surface of p-type semiconductor substrate 510 in a conventional manner. In the present example, hard mask 512 is an oxide mask that can be formed by depositing an oxide layer on the top surface of p-type semiconductor substrate 510, followed by the formation of a patterned photoresist layer on the top surface of the oxide layer.

The patterned photoresist layer is formed in a conventional manner, which includes depositing a layer of photoresist, projecting a light through a patterned black/clear glass plate known as a mask to form a patterned image on the layer of photoresist that softens the photoresist regions exposed by the light, and removing the softened photoresist regions.

After the patterned photoresist layer has been formed, the exposed region of the oxide layer is etched until the top surface of p-type semiconductor substrate 510 is exposed. Following the etch, the patterned photoresist layer is removed in a conventional fashion, such as with an ash process, to form hard mask 512.

Once hard mask 512 has been formed, the exposed region of p-type semiconductor substrate 510 is implanted with an n-type dopant to form an n+ buried layer 514 in the top surface of p-type semiconductor substrate 510. N+ buried layer 514 surrounds a number of strips 516 which lie below patterned photoresist layer 512.

Following this, the implant is conventionally annealed. The anneal causes the n-type dopants from n+ buried layer 514 to diffuse into the strips 516 and change the conductivity from p-type to n-type. As a result, the strips 516 have a lower n-type dopant concentration than the dopant concentration of n+ buried layer 514.

The n-type strips 516 correspond to the lighter n-type buried regions 220/222 and 420/422. (Alternately, a uniform n+ buried layer 514 can be obtained by not using patterned photoresist layer 512 to form the strips 516. SCR 100 and SCR 300 are examples of an SCR with a uniform n+ buried layer 514.) After the anneal, hard mask 512 is removed in a conventional fashion.

Figure 6B:
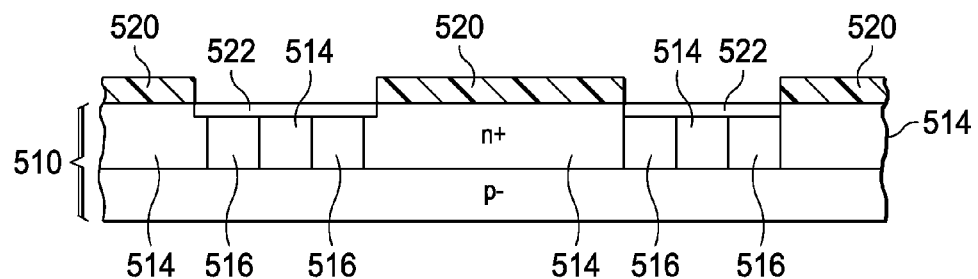
Figure 6C:
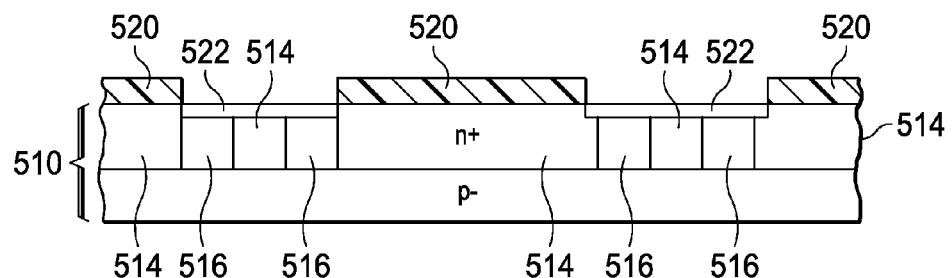
Figure 6A:
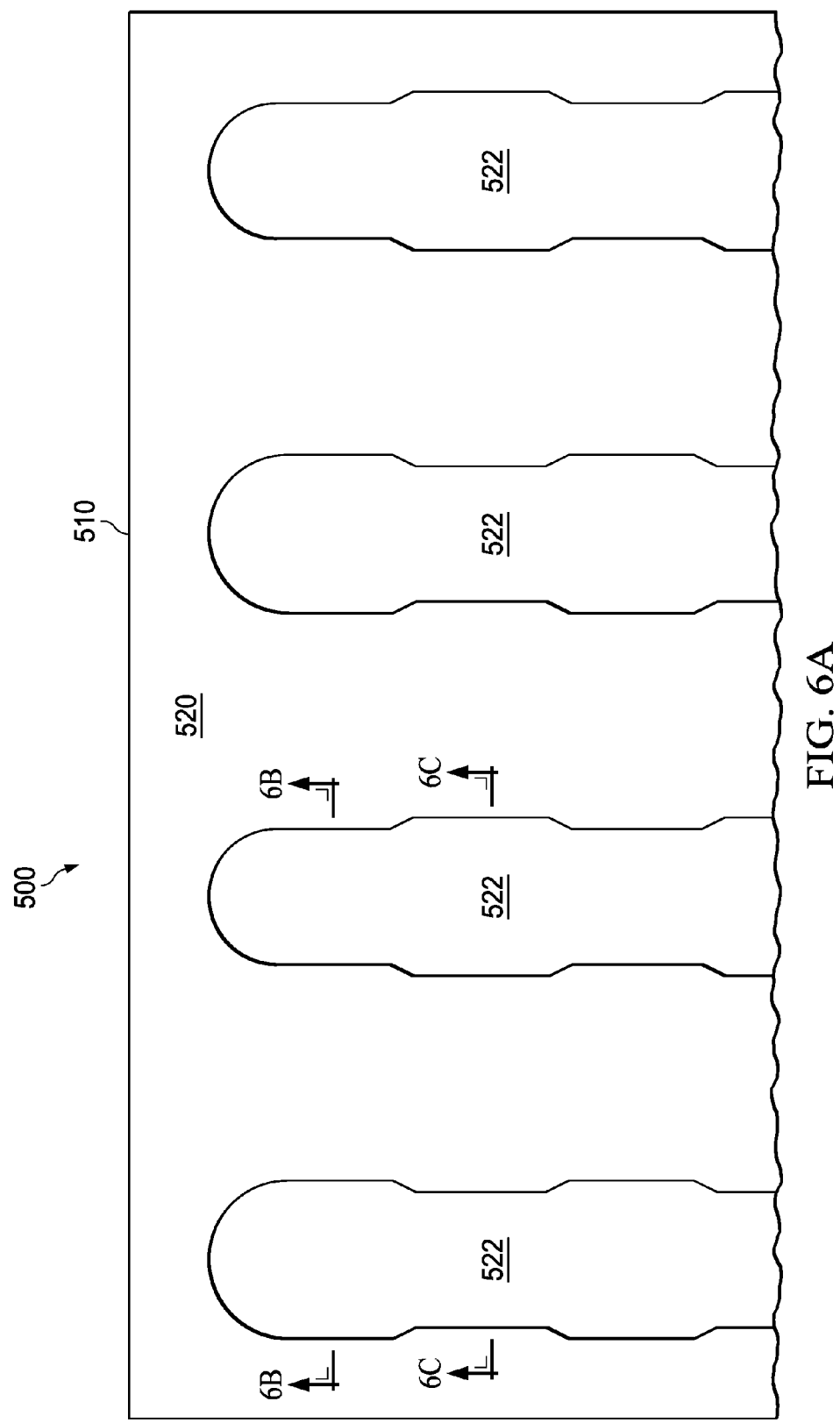

As shown in FIGS. 6A-6C, after n+ buried layer 514 and the n-type strips 516 have been formed, a patterned photoresist layer 520 is conventionally formed on the top surface of p-type semiconductor substrate 510. Once patterned photoresist layer 520 has been formed, the exposed regions of p-type semiconductor substrate 510 are implanted with a p-type dopant.

The implant forms a number of spaced-apart p+ buried layers 522 in the top surface of p-type semiconductor substrate 510 so that each p+ buried layer 522 lies over a pair of strips 516. Following this, patterned photoresist layer 520 is removed in a conventional fashion, and the implant is conventionally annealed. (Alternately, the p+ buried layers 522, which correspond to p+ buried layers 210/212 and 410/412, can be omitted. SCR 100 and SCR 300 are examples of an SCR with no p+ buried layer 522.)

Figure 7A:
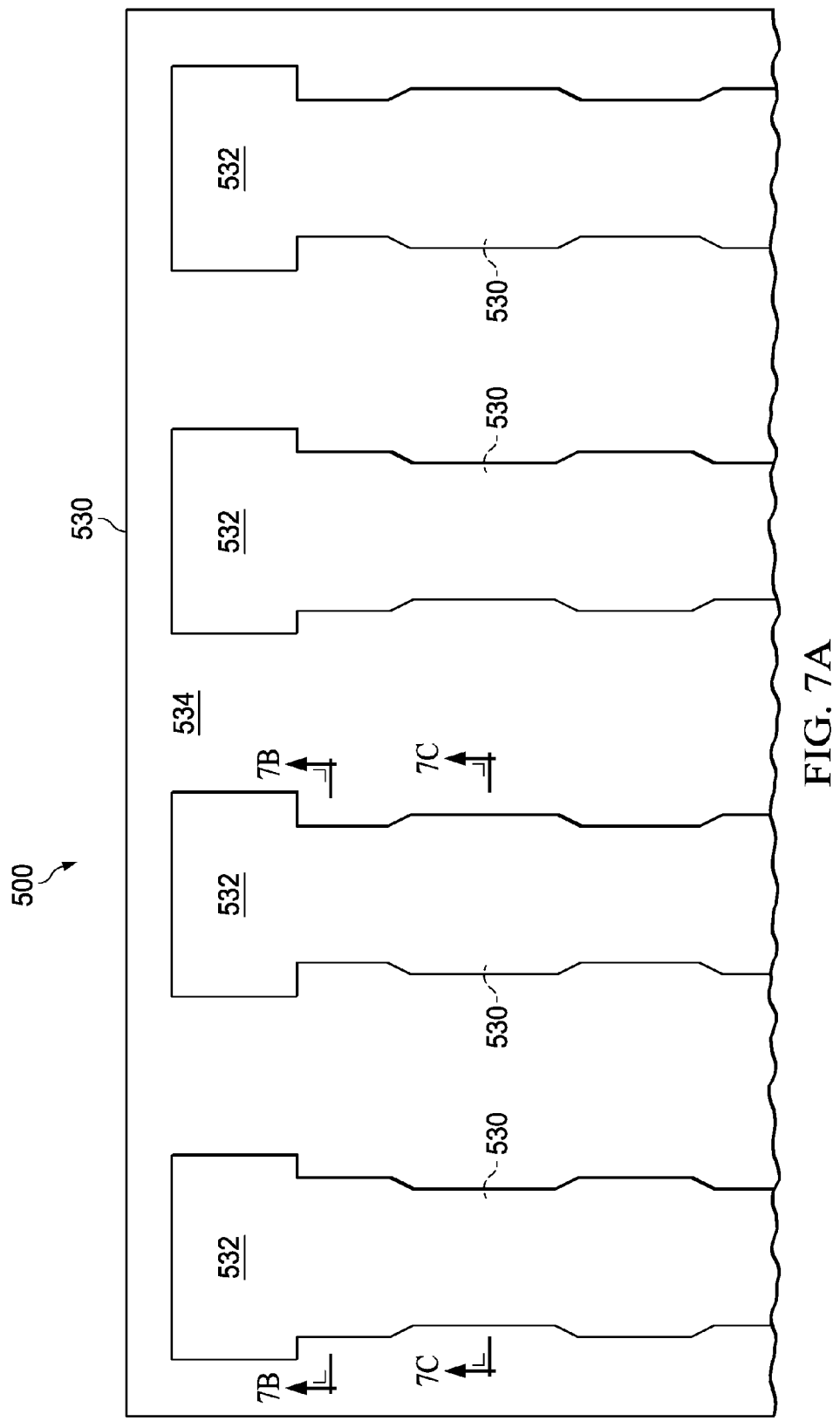
Figure 7B:
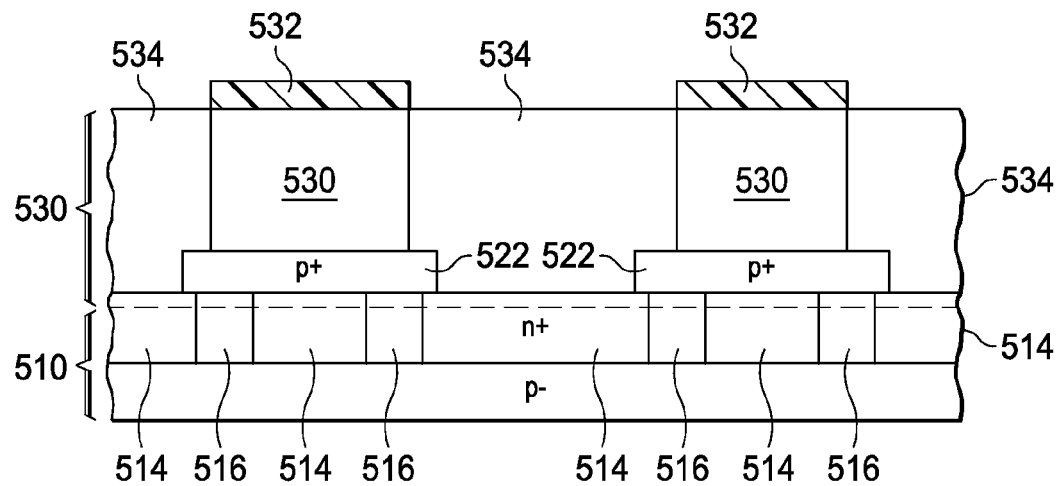
Figure 7C:
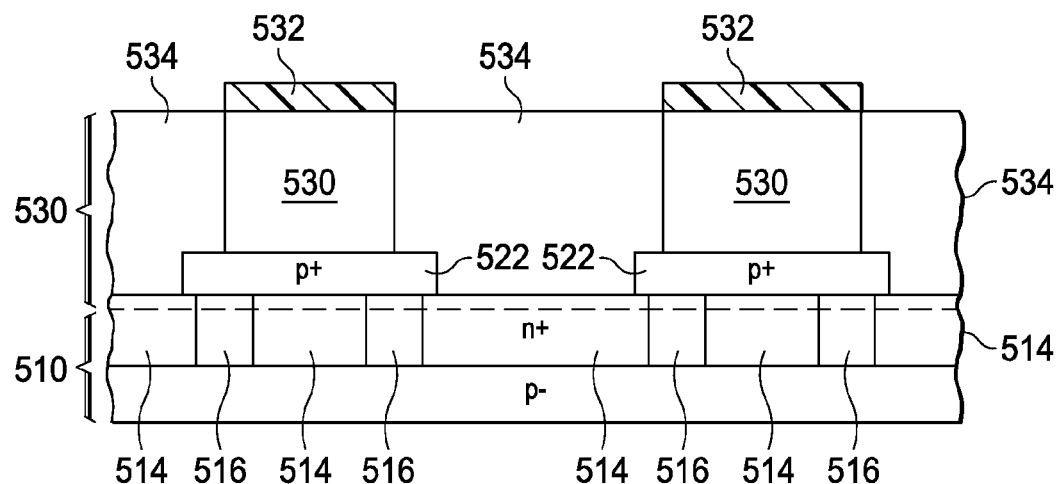

As shown in FIGS. 7A-7C, after the p+ buried layers 522 have been formed, a p-type epitaxial layer 530 is conventionally grown on the top surface of p− semiconductor substrate 510. In addition, the thermal treatment during the epitaxial growth causes the n+ buried layer 514 and the p+ buried layers 522 to diffuse up into the bottom of p-type epitaxial layer 530.

Next, a patterned photoresist layer 532 is conventionally formed on the top surface of p-type epitaxial layer 530. Following this, the exposed regions of p-type epitaxial layer 530 are implanted with an n-type dopant to form a deep n-type region 534 that extends through p-type epitaxial layer 530 to touch n+ buried layer 514. Deep n-type region 534 has a dopant concentration that is less than the dopant concentration of n+ buried layer 514. After this, patterned photoresist layer 532 is conventionally removed, and the implant is conventionally annealed.

Figure 8A:
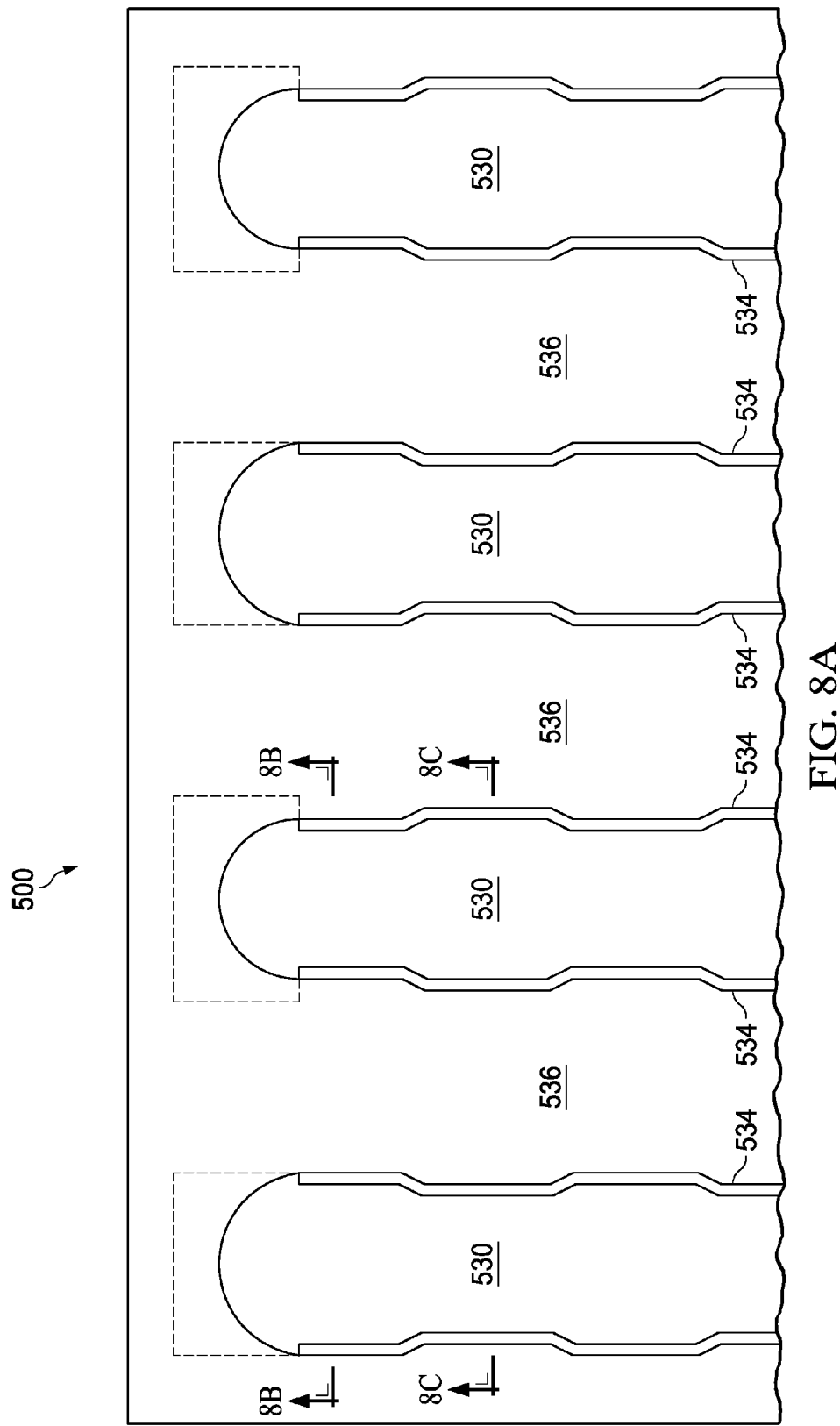
Figure 8B:
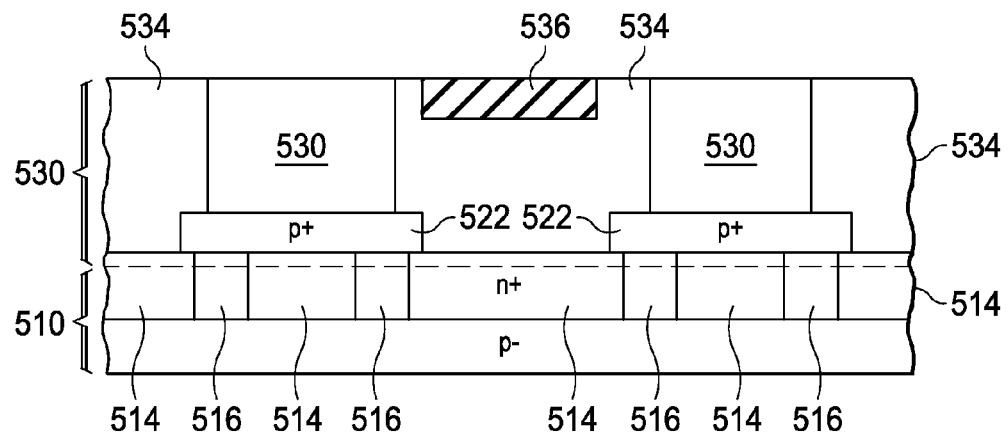
Figure 8C:
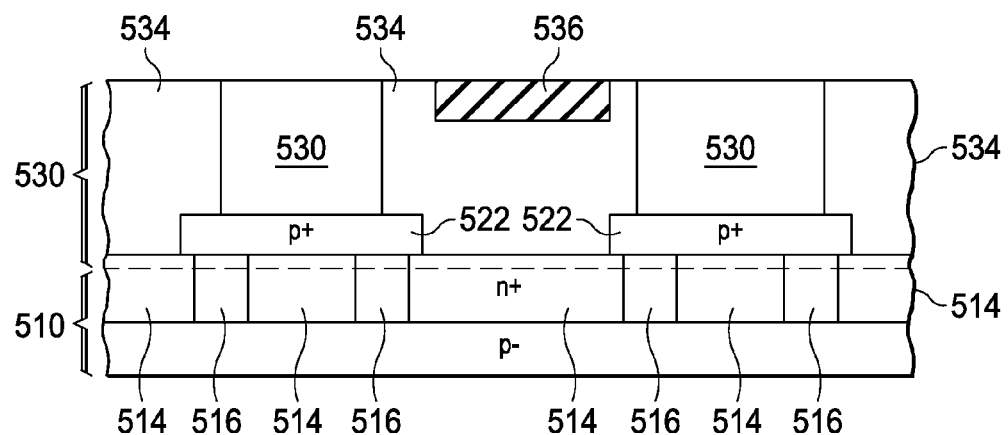

As shown in FIGS. 8A-8C, after deep n-type region 534 has been formed, a shallow trench isolation (STI) region 536 is conventionally formed in p-type epitaxial layer 530. For example, STI region 536 can be formed by etching openings into the top surface of p-type epitaxial layer 530, followed by the deposition of an oxide that fills the openings and a subsequent planarization of the oxide, such as by chemical-mechanical polishing.

Figure 9A:
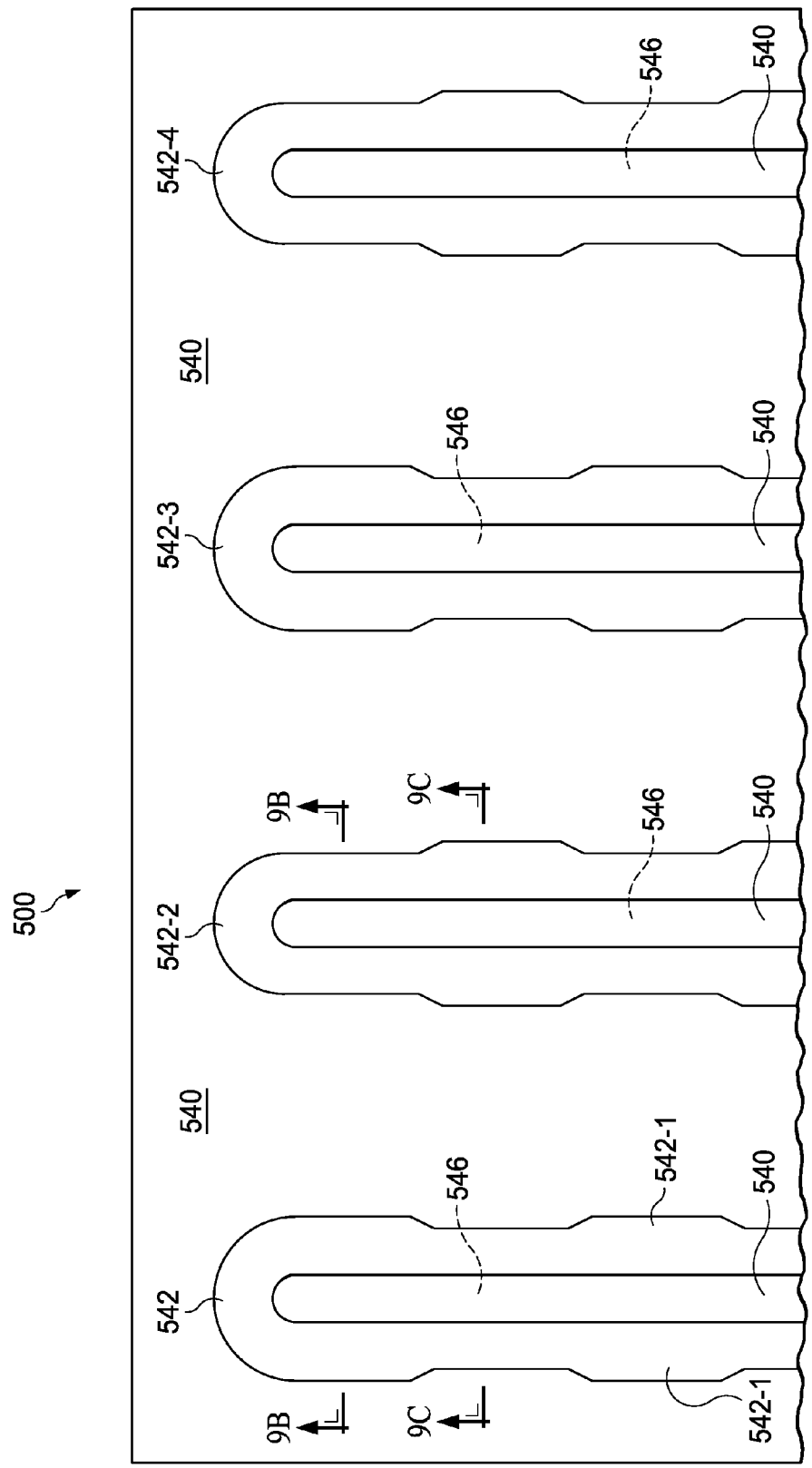
Figure 9B:
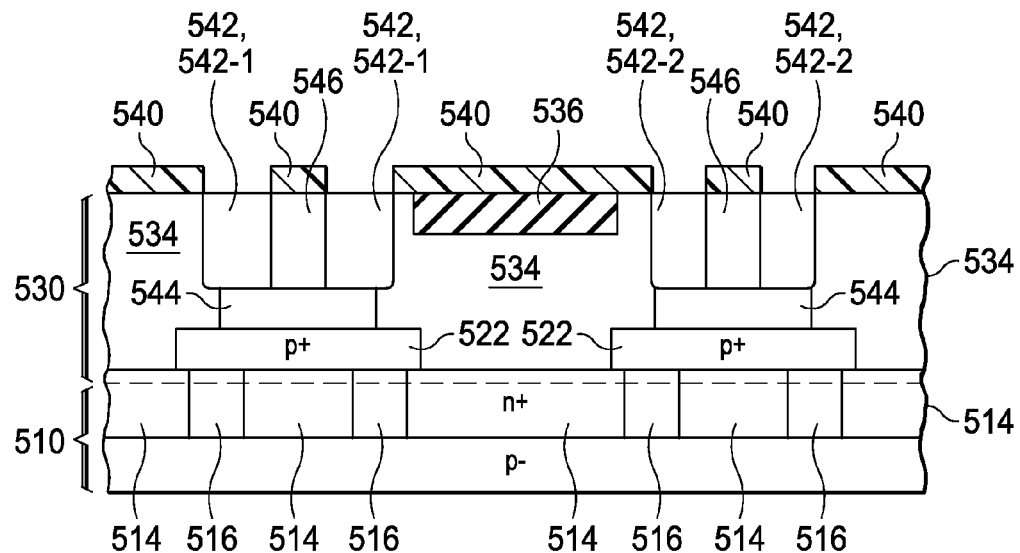
Figure 9C:
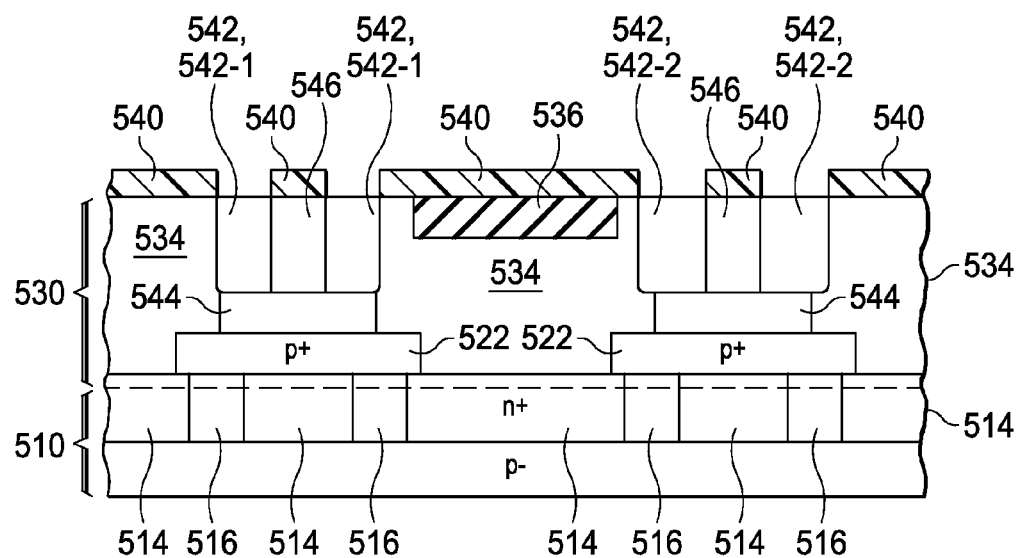

As shown in FIGS. 9A-9C, once STI region 536 has been formed, a patterned photoresist layer 540 is formed on the top surface of p-type epitaxial layer 530. Following this, the exposed regions of p-type epitaxial layer 530 are implanted with a p-type dopant to form a number of p-type shallow wells 542 within p-type epitaxial layer 530. The p-type shallow wells 542 include a p-type shallow well 542-1, a p-type shallow well 542-2, a p-type shallow well 542-3, and a p-type shallow well 542-4. (Rather than using a p-type epitaxial layer 530 with n-type and p-type implants to form the structures, an n-type epitaxial layer can alternately be used with n-type and p-type implants to form the structures.)

In the present example, the p-type shallow wells 542 are formed to have a racetrack shape (the figures showing one end of the racetrack) with an elongated native p-type center region. In addition, the implant also defines a number of p-type native regions 544 that lie below the p-type shallow wells 542.

Further, each p-type shallow well 542 has a number of alternating wider regions and narrower regions which are arranged so that the wider regions have horizontally adjacent narrower regions, and the narrower regions have horizontally adjacent wider regions. After this, patterned photoresist layer 540 is removed is a conventional manner, and the implant is conventionally annealed. (Although the p-type shallow wells 542 are illustrated with a racetrack shape, the p-type shallow wells 542 can alternately be formed as strips.)

The anneal causes p-type dopants from the p-type shallow wells 542 to diffuse outward into the elongated native p-type center regions to form a number of p-type diffused regions 546, and into the p-type native regions 544 to reduce the sizes of the p-type native regions 544. The p-type diffused regions 546 have dopant concentrations that are greater than the dopant concentrations of the p-type native regions 544, and less than the dopant concentrations of p-type shallow wells 542. The p-type shallow wells 542 have dopant concentrations that are more than the dopant concentrations of the p-type native regions 544.

Figure 10A:
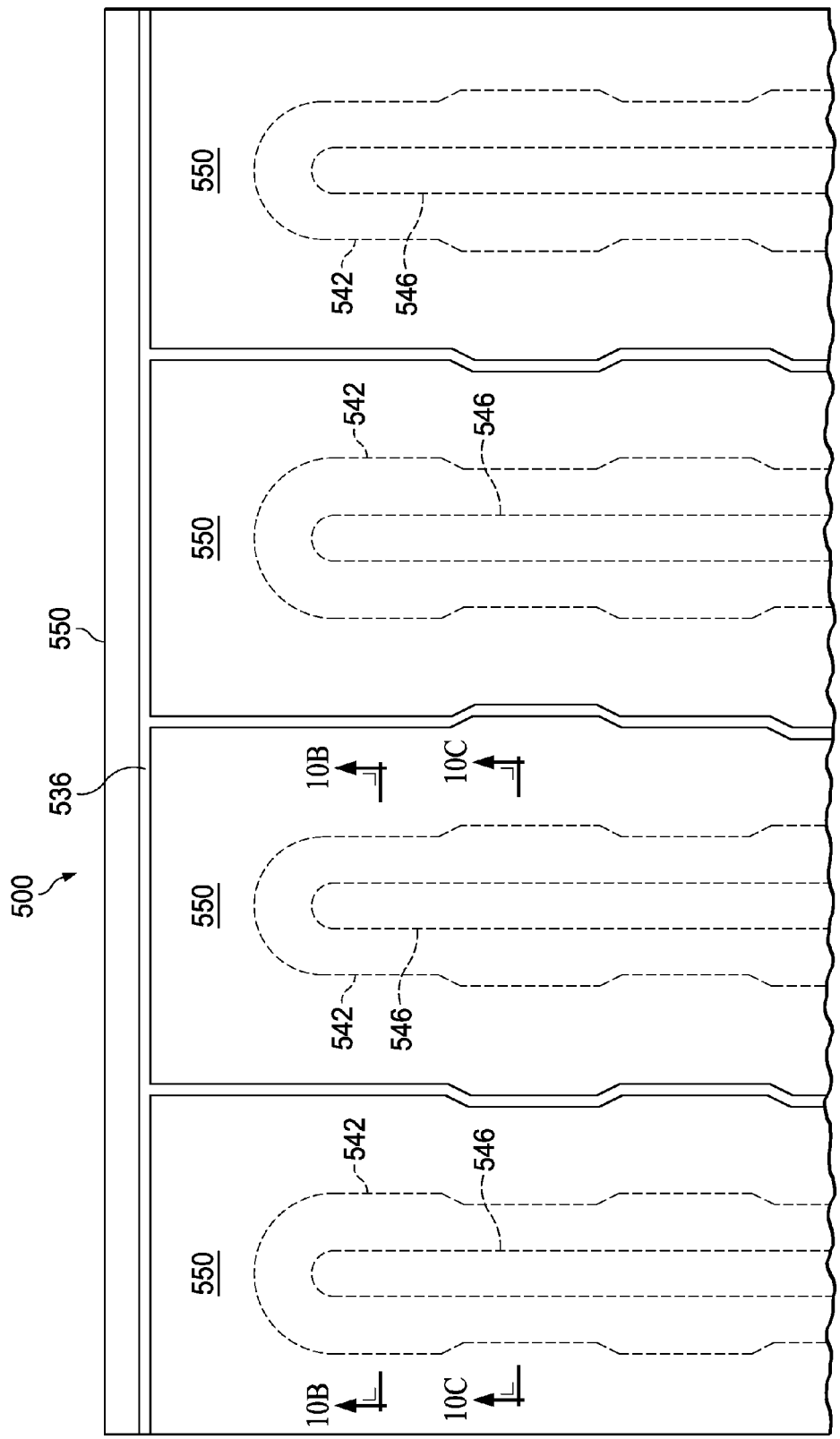
Figure 10B:
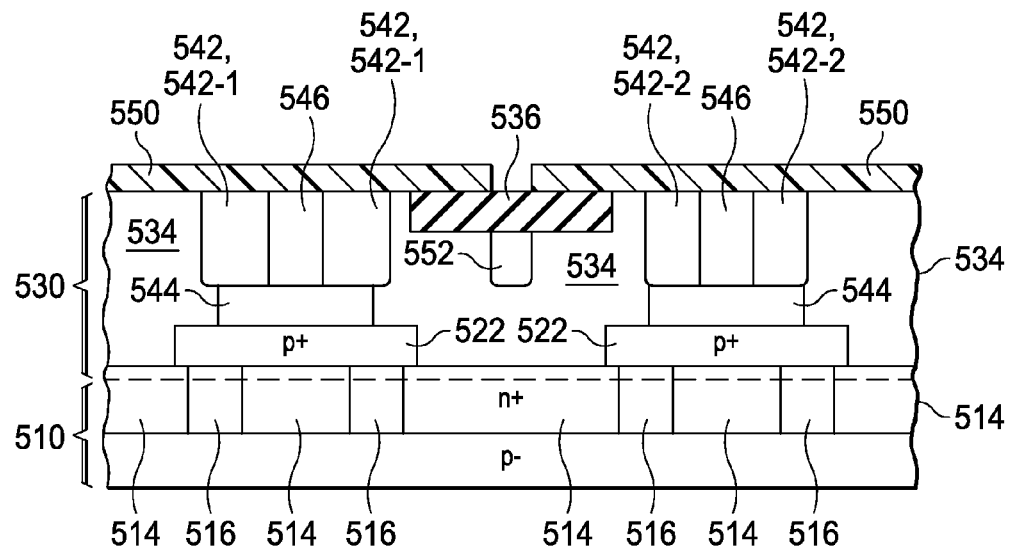
Figure 10C:
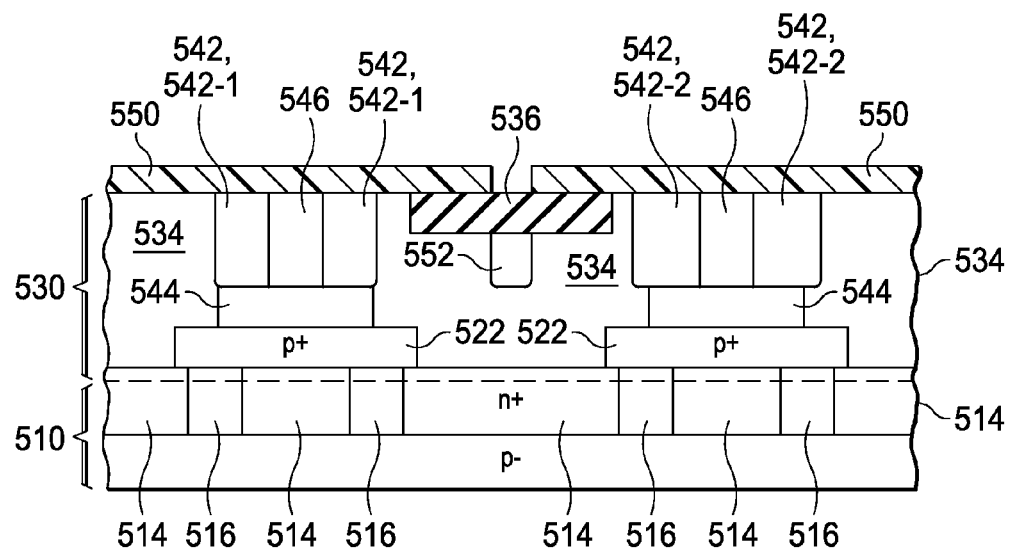

As shown in FIGS. 10A-10C, once the p-type diffused regions 546 have been formed, a patterned photoresist layer 550 is formed on the top surface of p-type epitaxial layer 530. Following this, the exposed regions of p-type epitaxial layer 530 are implanted with an n-type dopant through STI region 536 to form an n-type shallow drain well 552 within p-type epitaxial layer 530.

N-type shallow drain well 552 lies between each pair of adjacent p-type shallow wells 542, and closer to one adjacent p-type shallow well 542 than to the other adjacent p-type shallow well 542. After this, patterned photoresist layer 550 is removed in a conventional fashion, and the implant is conventionally annealed.

Figure 11A:
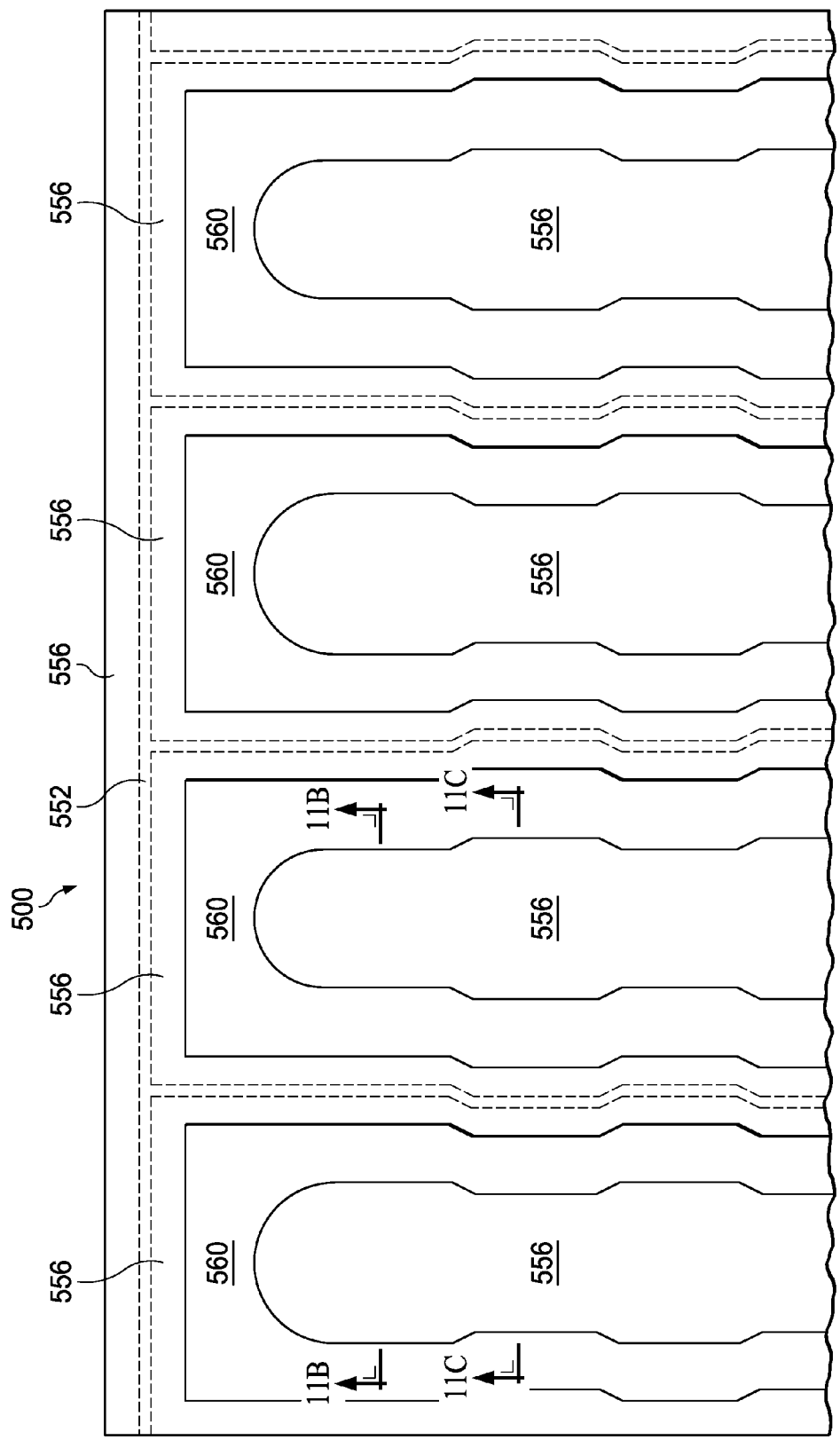
Figure 11B:
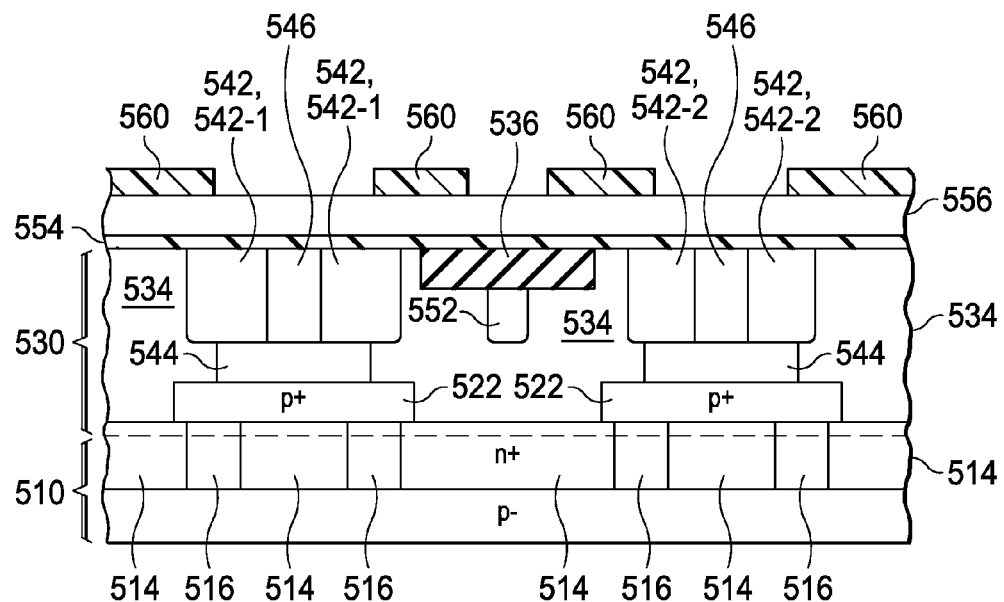
Figure 11C:
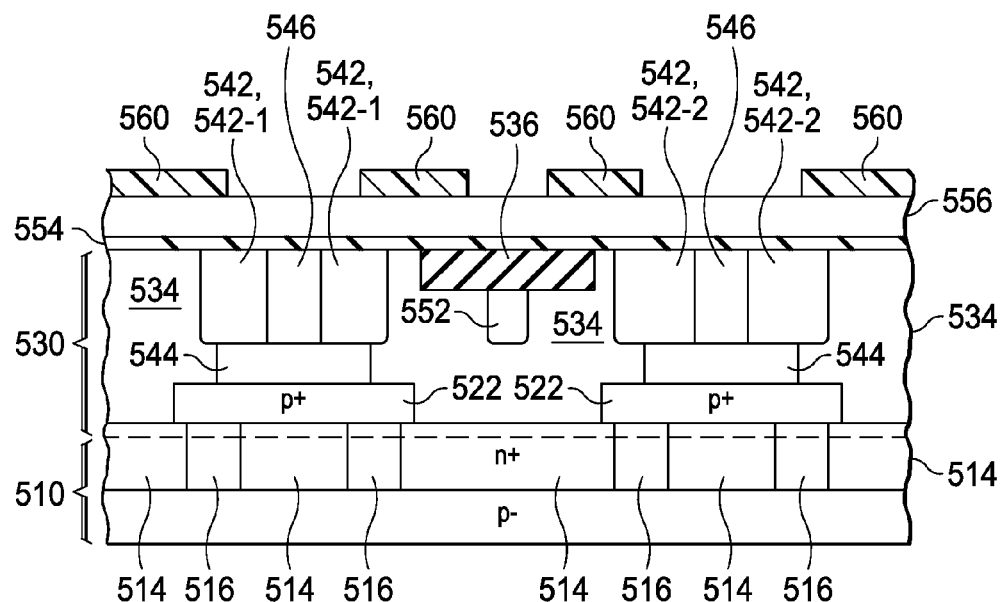

As shown in FIGS. 11A-11C, once n-type shallow drain well 552 has been formed, a gate oxide layer 554 is formed in a conventional manner on the top surface of p-type epitaxial layer 530, followed by the conventional formation of a polysilicon layer 556. Next, a patterned photoresist layer 560 is formed on the top surface of polysilicon layer 556.

Figure 12A:
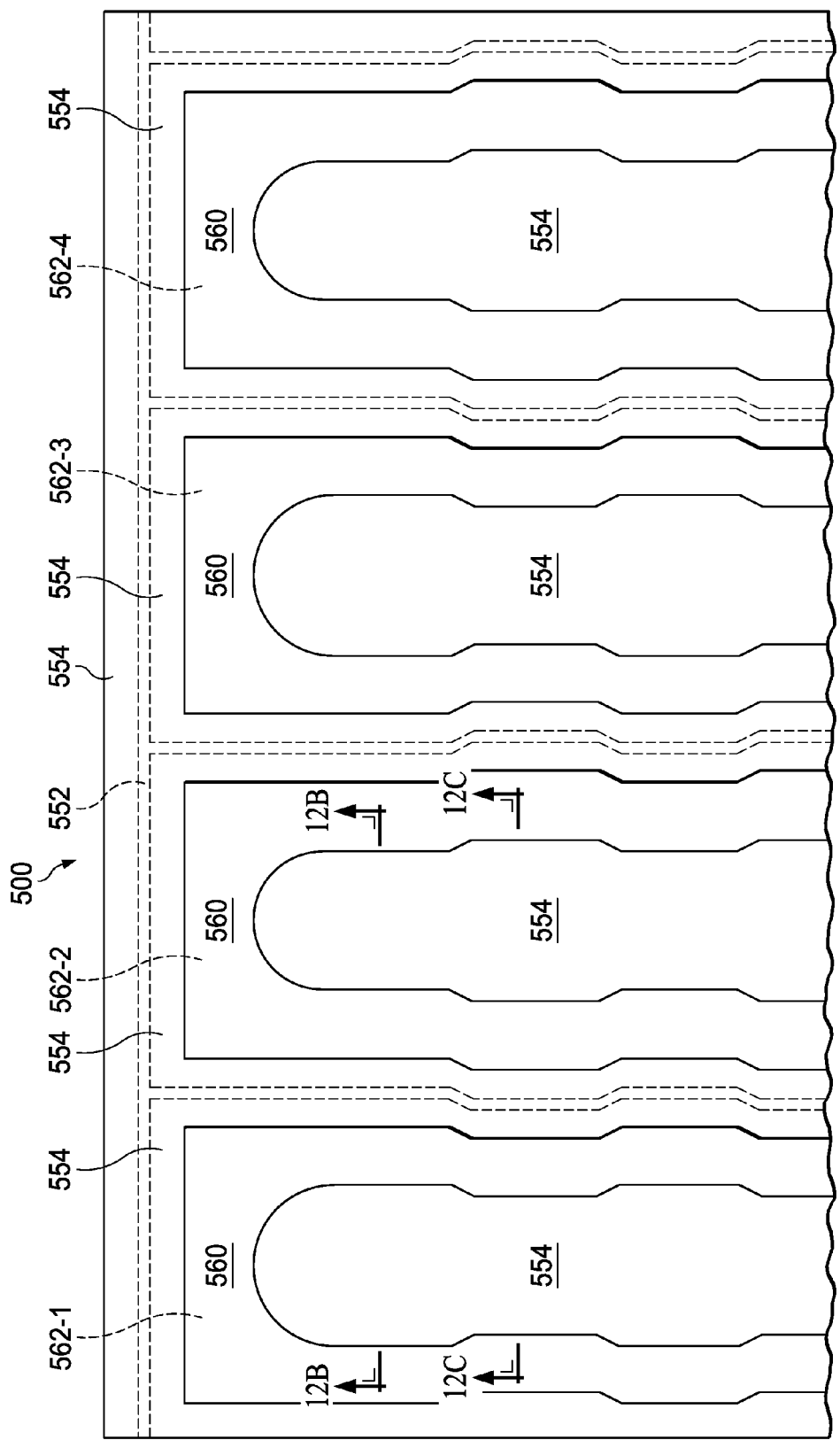
Figure 12B:
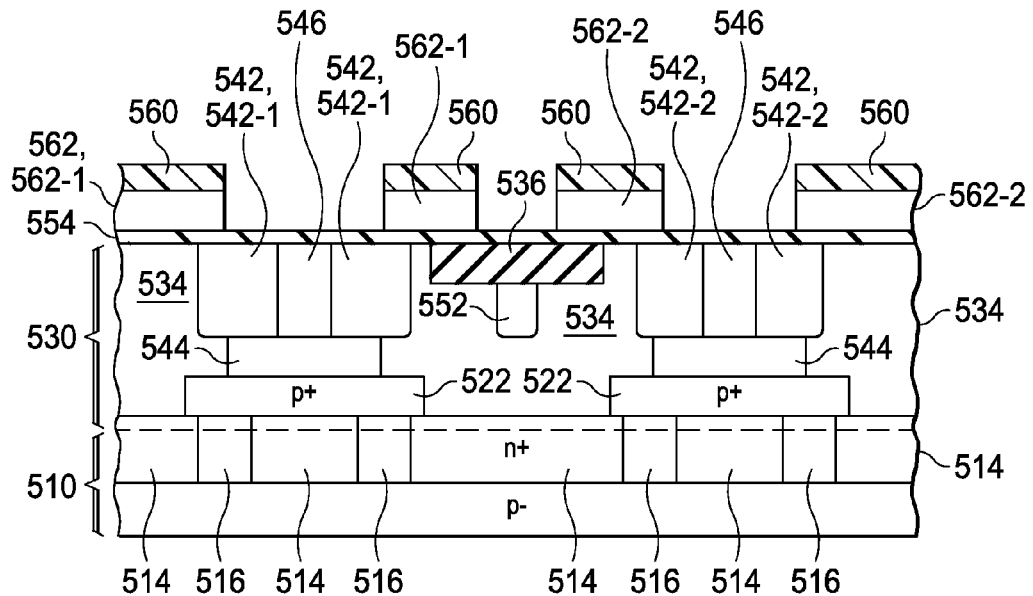
Figure 12C:
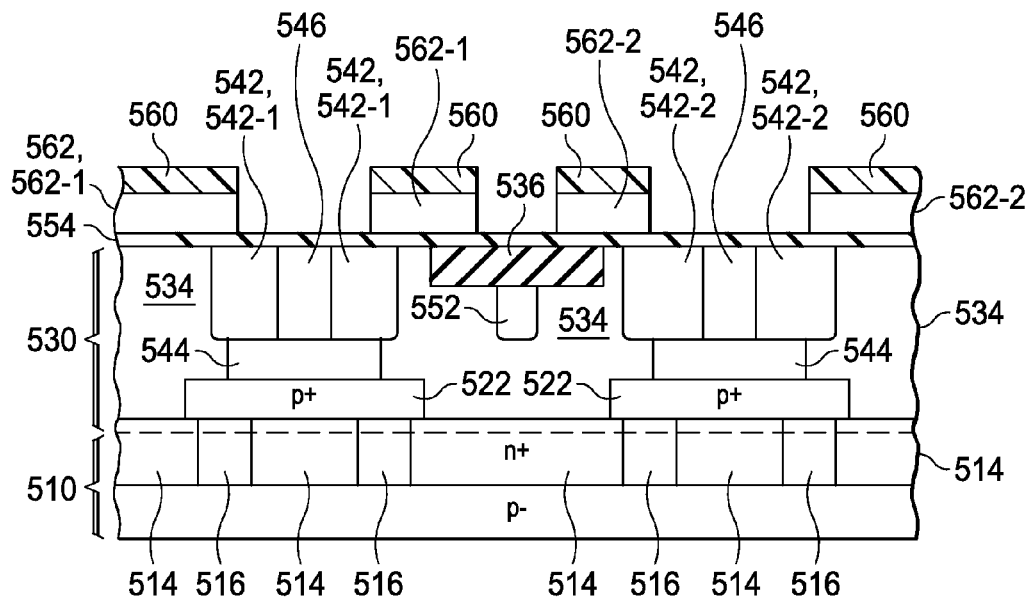

Following this, as shown in FIGS. 12A-12C, the exposed regions of polysilicon layer 556 are etched in a conventional fashion to form a number of gates 562. The gates 562 include a first gate 562-1, a second gate 562-2, and third gate 562-3, and a fourth gate 562-4. Each gate 562 lies over a portion of deep n-type well 534, STI region 536, and a p-type shallow well 542. After this, patterned photoresist layer 560 is removed in a conventional manner.

Figure 13A:
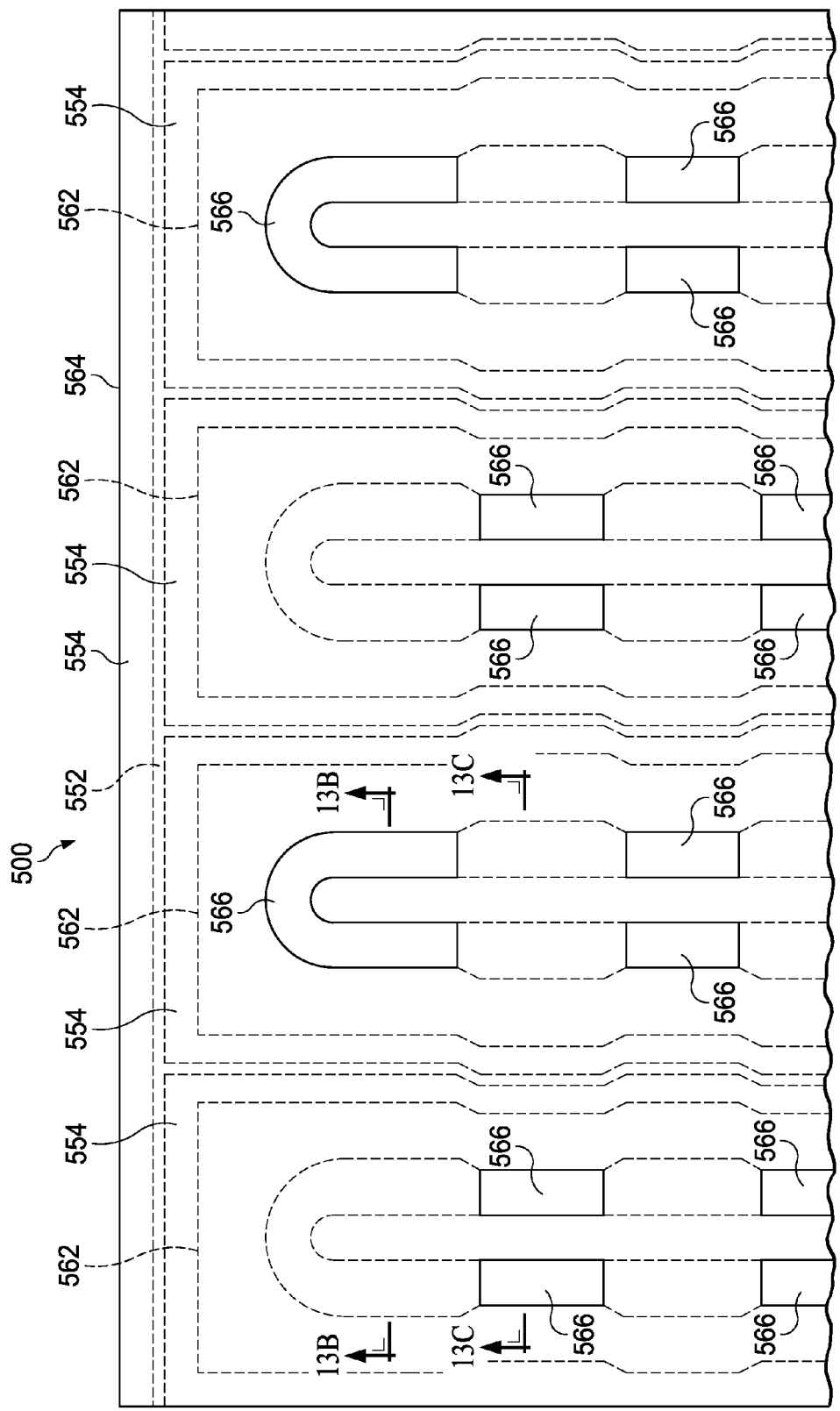
Figure 13B:
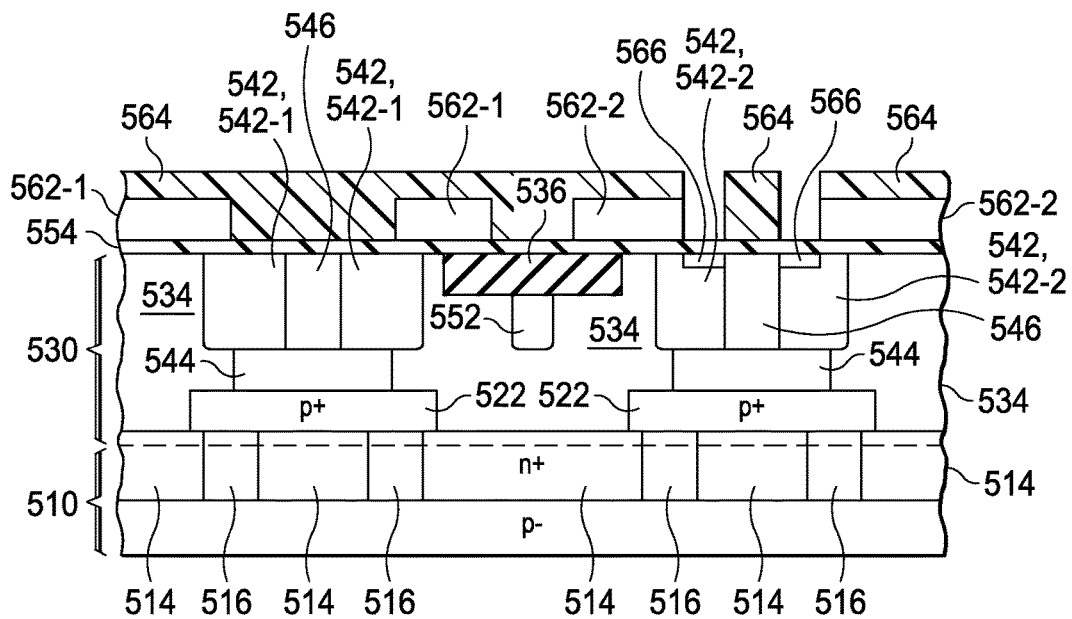
Figure 13C:
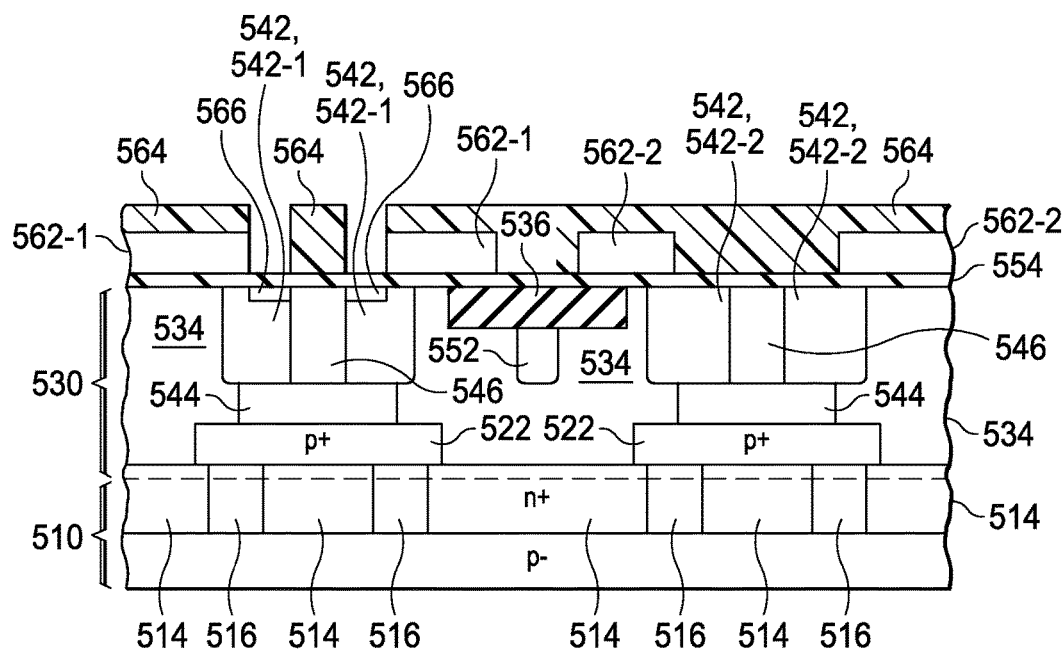

As shown in FIG. 13A-13C, after the gates 562 have been formed, a patterned photoresist layer 564 is formed over gate oxide layer 554 and the gates 562. Next, an n-type dopant is optionally implanted into the p-type shallow wells 542 to form a number of lightly-doped (LDD type) regions 566. After this, patterned photoresist layer 564 is conventionally removed, and the implant is annealed is a conventional manner.

Figure 14A:
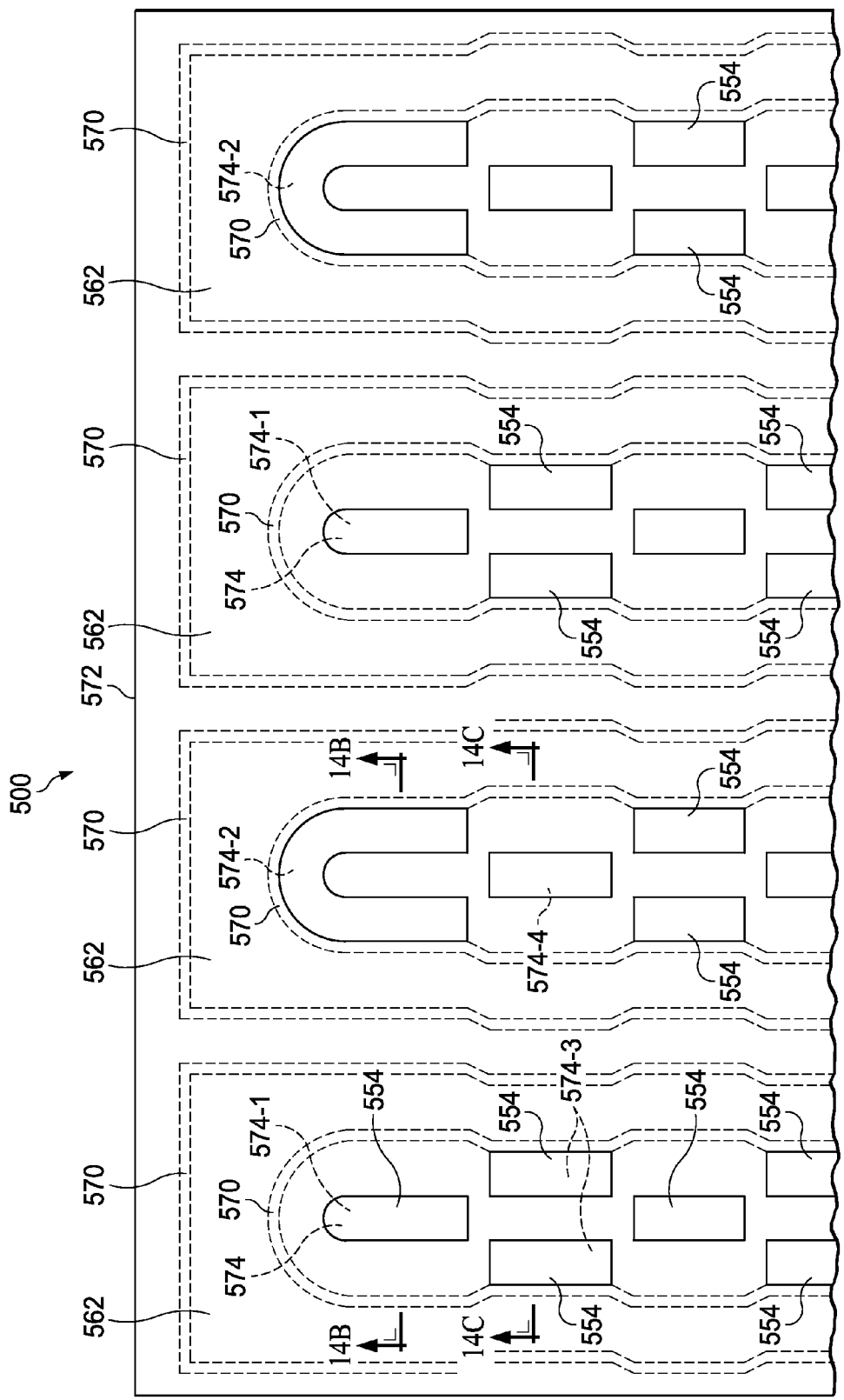
Figure 14B:
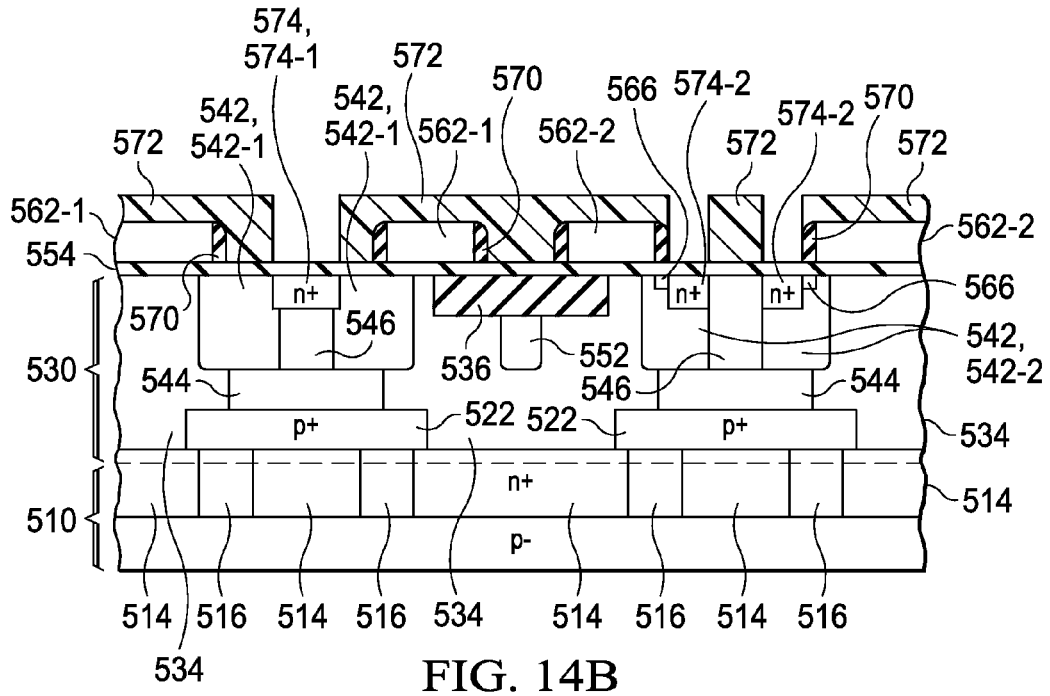
Figure 14C:
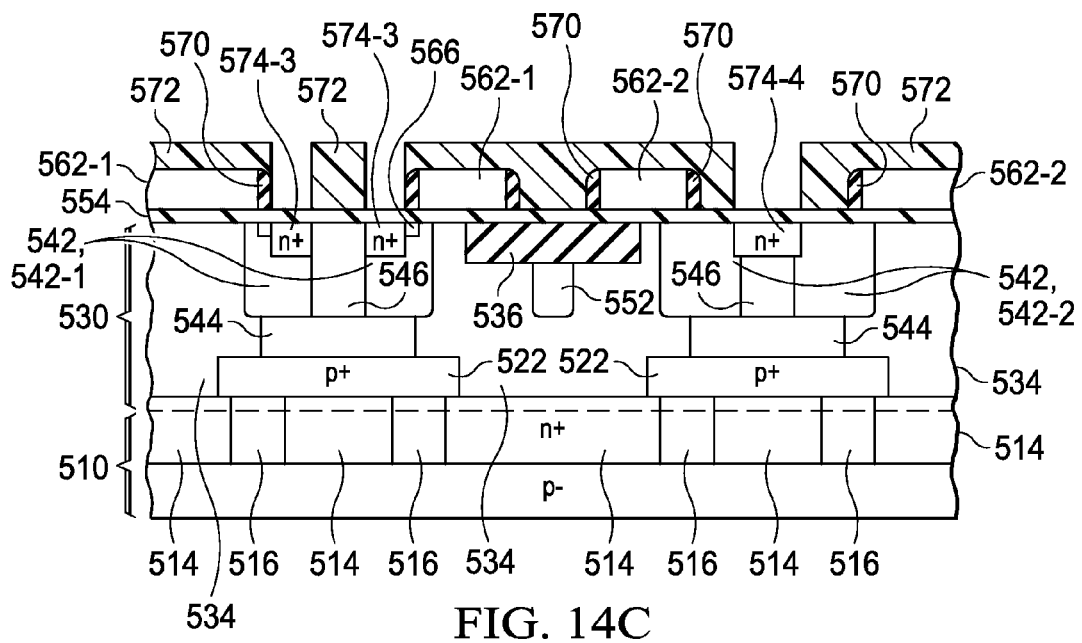

As shown in FIG. 14A-14C, after the lightly-doped regions 566 have been formed, a number of sidewall spacers 570 are formed in a conventional manner to surround the gates 562. For example, the sidewall spacers 570 can be formed by depositing a thin layer of oxide, followed by a thicker layer of nitride. After this, the thicker layer of nitride and then the thin layer of oxide are anisotropically etched until the thin layer of oxide has been removed from the top surface of the gates 562 to form the sidewall spacers 570.

Once the sidewall spacers 570 have been formed, a patterned photoresist layer 572 is formed over gate oxide layer 554 and the gates 562. Next, an n-type dopant is implanted into epitaxial layer 530 to form a number of n+ source regions 574. The n+ source regions 574 include an n+ source region 574-1, an n+ source region 574-2, an n+ source region 574-3, and an n+ source region 574-4. (The n+ regions 574 are labeled as source regions because the SCRs are similar to a merged drain extended MOS (DEMOS) transistor with the n-type shallow well 552 as a shared drain.) Following this, patterned photoresist layer 572 is removed in a conventional manner, and the implant is annealed is a conventional fashion.

Figure 15A:
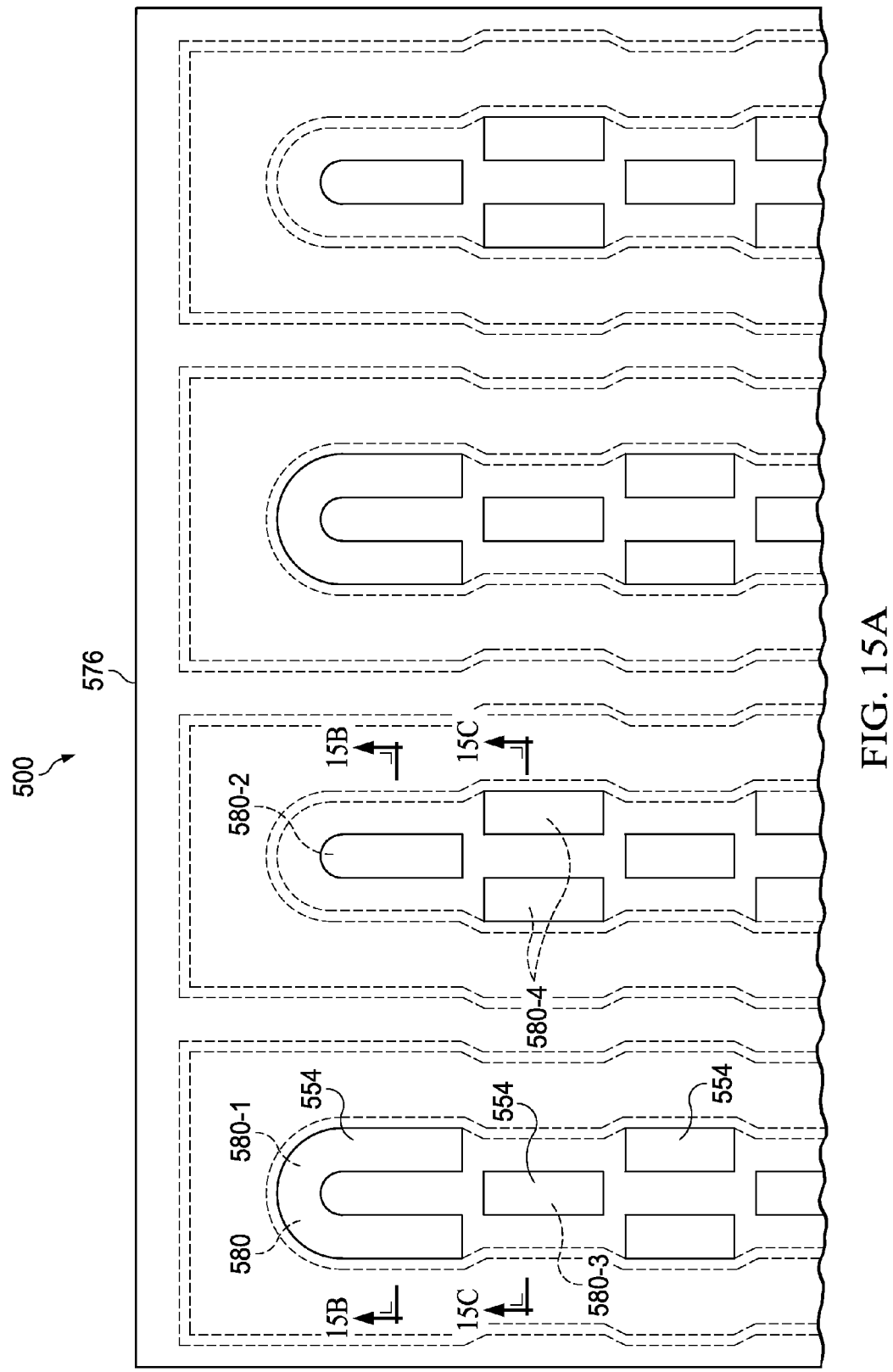
Figure 15B:
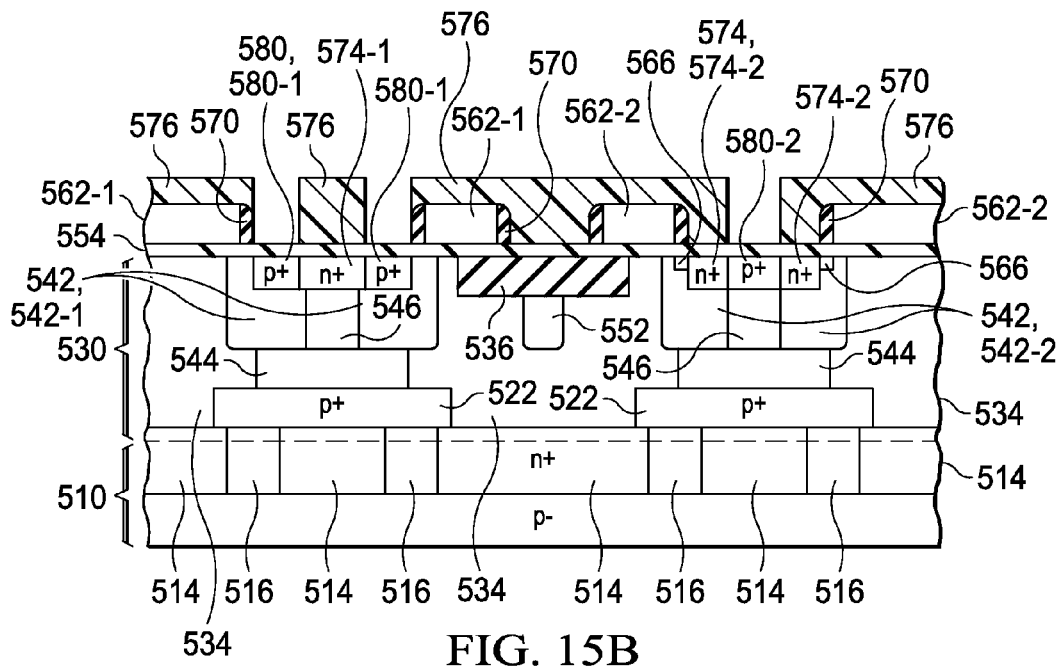
Figure 15C:
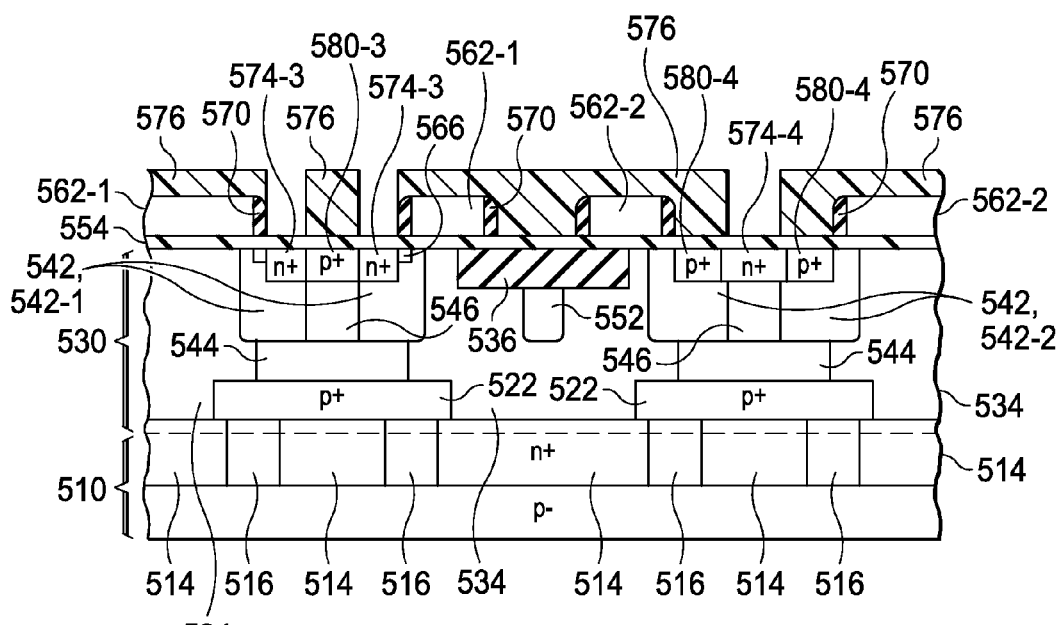

As shown in FIG. 15A-15C, after the n+ source regions 574 have been formed, a patterned photoresist layer 576 is formed over gate oxide layer 554 and the gates 562. Next, a p-type dopant is implanted into epitaxial layer 530 to form a number of p+ contact regions 580. The p+ contact regions 580 include a p+ contact region 580-1, a p+ contact region 580-2, a p+ contact region 580-3, and a p+ contact region 580-4. Following this, patterned photoresist layer 576 is conventionally removed, and the implant is annealed is a conventional manner.

Figure 16A:
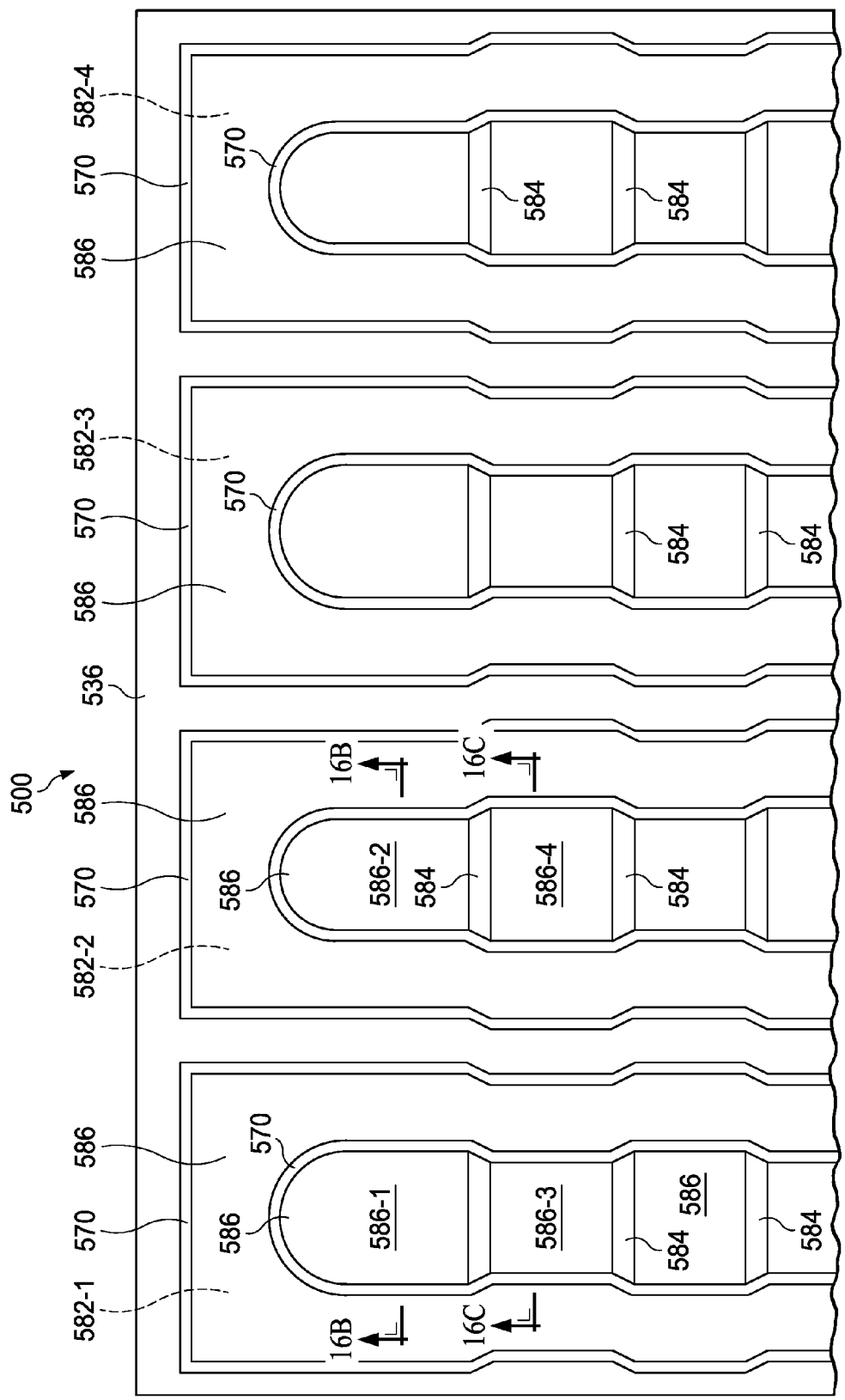
Figure 16B:
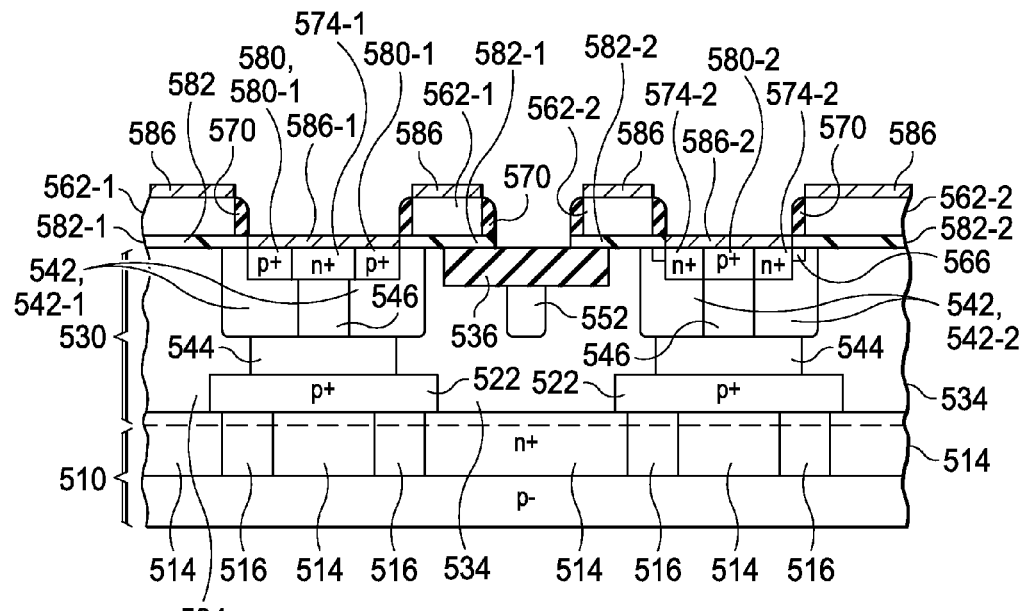
Figure 16C:
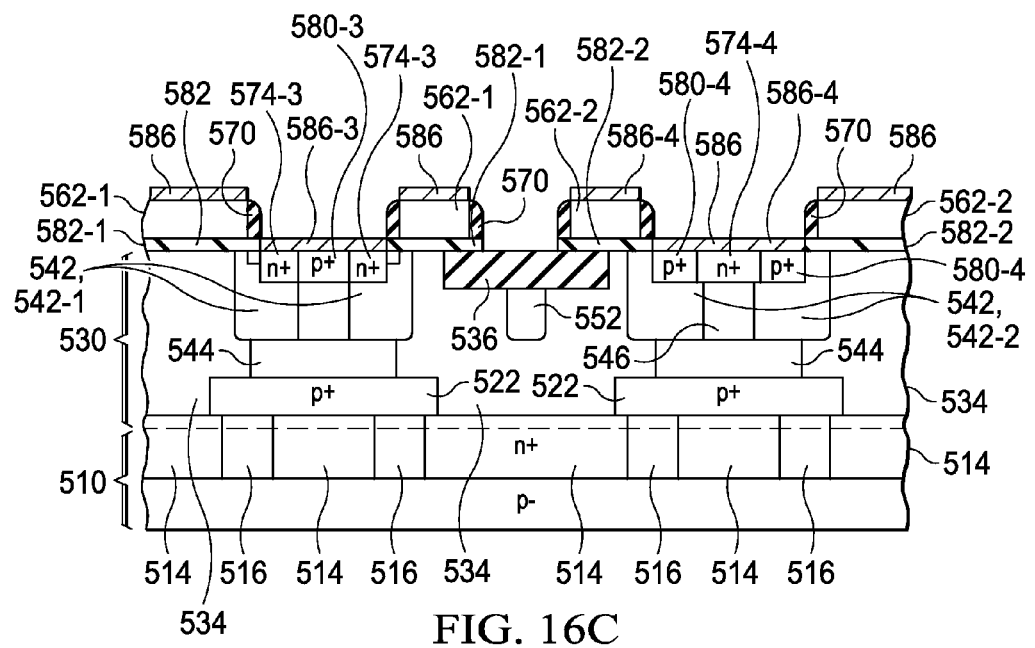

As shown in FIG. 16A-16C, after the p+ contact regions 580 have been formed, the exposed regions of gate oxide layer 554 are removed to expose the top surface of epitaxial layer 530 and form a number of gate oxide regions 582 that underlie the gates 562. The gate oxide regions 582 include a gate oxide region 582-1 that underlies gate 562-1, a gate oxide region 582-2 that underlies gate 562-2, a gate oxide region 582-3 that underlies gate 562-3, and a gate oxide region 582-4 that underlies gate 562-4.

Next, a silicide block layer 584 is formed on epitaxial layer 530 in a conventional manner. In the present example, silicide block layer 584 is an oxide layer that can be formed by depositing an oxide layer on the top surface of epitaxial layer 530, followed by the formation of a patterned photoresist layer on the top surface of the oxide layer.

After the patterned photoresist layer has been formed, the exposed regions of the oxide layer are etched until a number of openings have been formed through the oxide layer that expose the top surface of epitaxial layer 530 and the top surfaces of the gates 562. Following the etch, the patterned photoresist layer is removed in a conventional fashion to form silicide block layer 584.

Once silicide block layer 584 has been formed, the exposed regions of epitaxial layer 530 and the gates 562 are silicided in a conventional fashion. In the present example, a layer of metal silicide is deposited and then annealed. The excess metal is next removed, followed by another anneal to react any unreacted metal.

The silicidation forms a number of metal silicide regions 586 on the gates 562, the n+ source regions 574 and the p+ contact regions 580. The metal silicide regions 586 include a metal silicide region 586-1 formed on n+ source regions 574-1 and p+ contact regions 580-1, a metal silicide region 586-2 formed on n+ source regions 574-2 and p+ contact regions 580-2, a metal silicide region 586-3 formed on n+ source regions 574-3 and p+ contact regions 580-3, and a metal silicide region 586-4 formed on n+ source regions 574-4 and p+ contact regions 580-4. After this, patterned photoresist layer 584 is removed in a conventional manner.

Figure 17A:
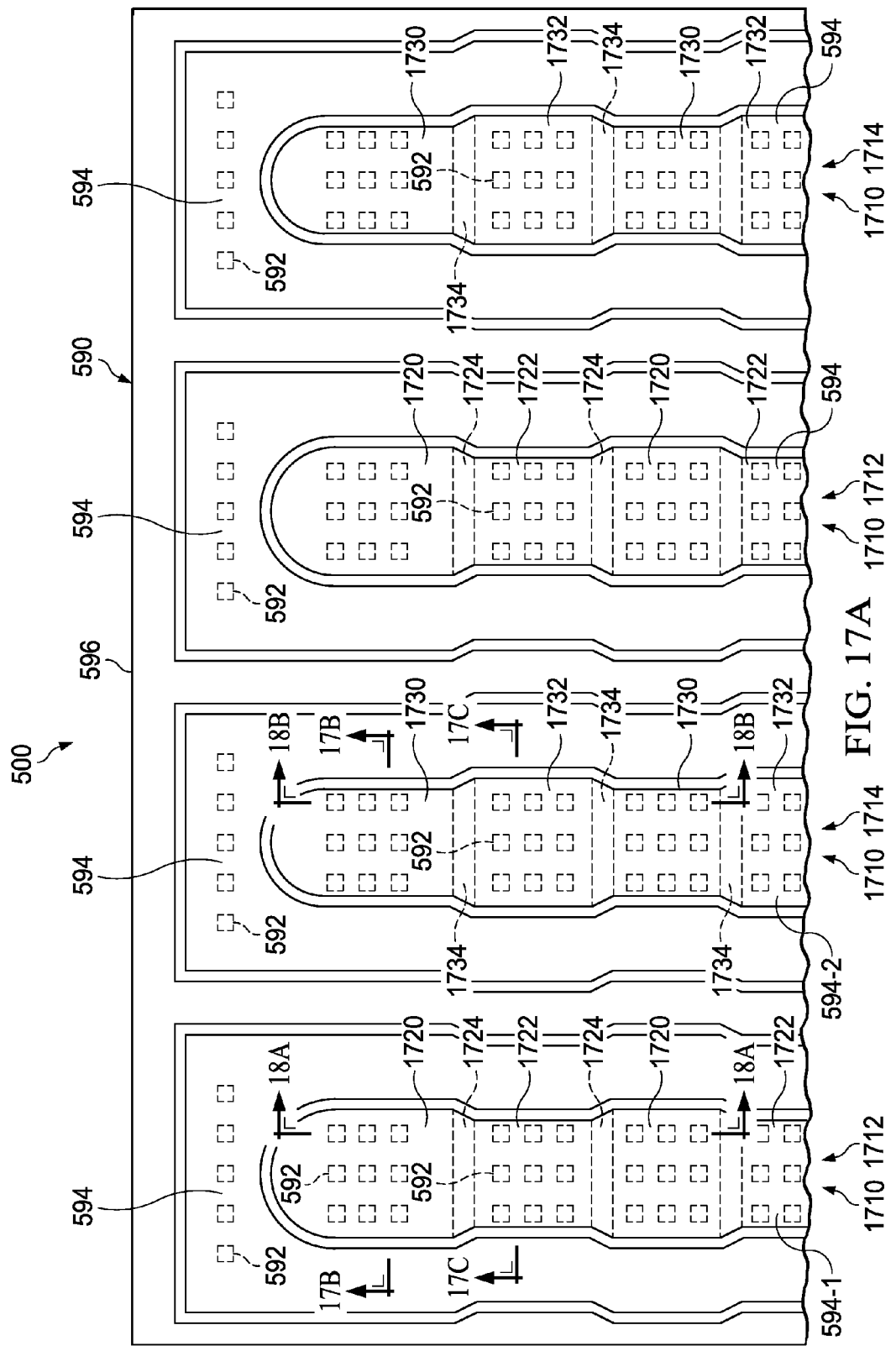
Figure 17B:
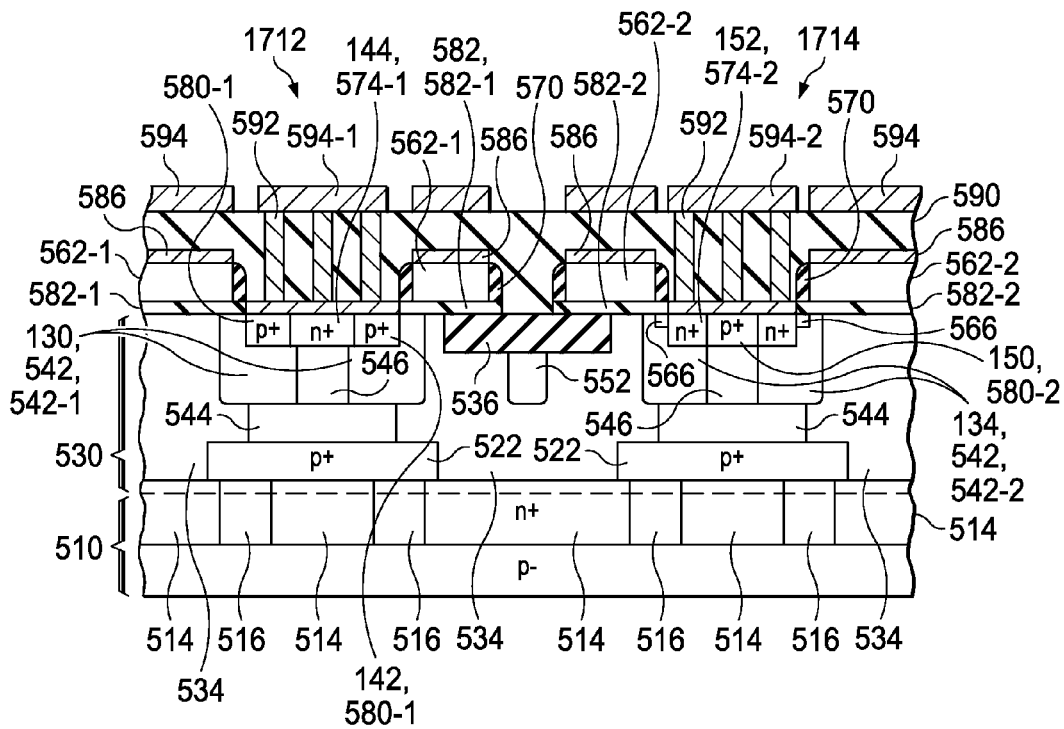
Figure 17C:
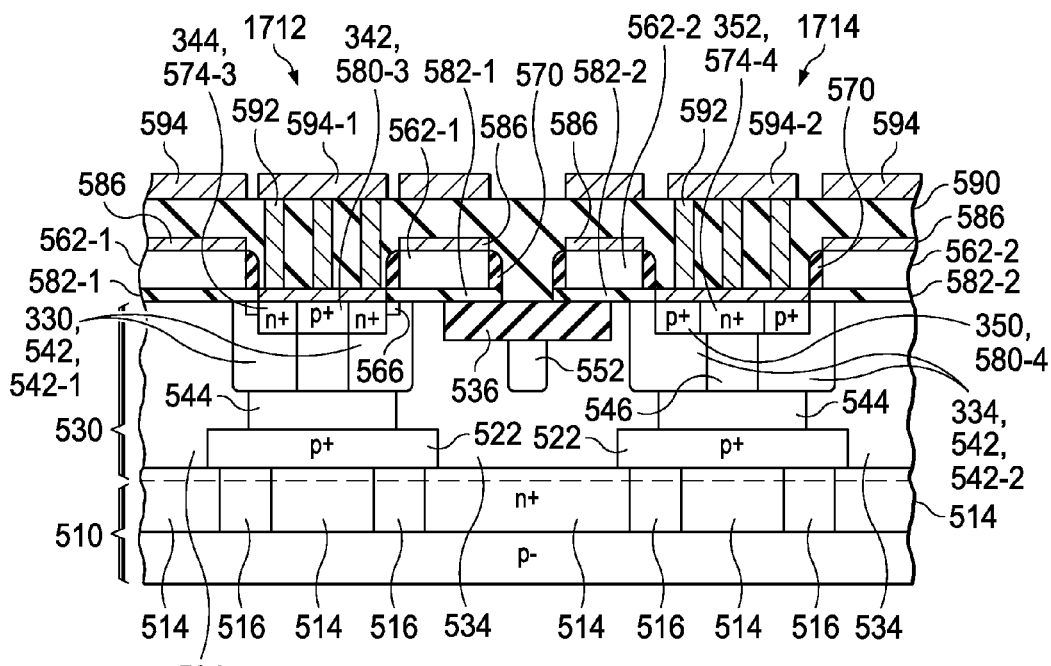

As shown in FIG. 17A-17C, after the silicide regions 586 have been formed, a dielectric layer 590 is formed in a conventional manner on epitaxial layer 530, STI region 536, and the silicide regions 586. Next, a number of metal contacts 592 are formed in a conventional fashion to extend through dielectric layer 590 to make electrical connections with the silicide regions 586.

For example, a patterned photoresist layer can be formed on dielectric layer 590, followed by an etch of the exposed regions of dielectric layer 590 to form openings in dielectric layer 590 that expose the top surfaces of the silicide regions 586. After this, a layer of metal is deposited to fill up the openings, followed by a planarization step, such as chemical-mechanical polishing, that removes the metal layer from the top surface of dielectric layer 590, thereby leaving the metal contacts 592.

Once the metal contacts 592 have been formed, method 500 next forms a number of metal-1 traces 594 in a conventional manner on the top surface of dielectric layer 590 to touch the metal contacts 592. The metal-1 traces 594 include a first metal-1 trace 594-1 and a second metal-1 trace 594-2. For example, a layer of metal can be deposited of the top surface of dielectric layer 590, followed by the formation of a patterned photoresist layer on the metal layer.

After this, the exposed regions of the metal layer are etched to expose the top surface of dielectric layer 590 and form the metal-1 traces 594. The patterned photoresist layer is then removed. The formation of the metal-1 traces 594 completes the formation of an ESD structure 596. Method 500 then continues in a conventional fashion with the formation of additional layers of dielectric, vias, and metal traces.

Thus, as shown in FIGS. 2, 4, 17A, 17B, and 17C, method 500 forms alternating rows of SCRs 200 and SCRs 400 (and the formation of alternating rows of SCRs 100 and SCRs 300 when the strips 516 and the p+ buried layers 522 are omitted). Each row of SCRs 200 includes a large number of merged SCRs 200 where adjacent SCRs 200 share common structures. Similarly, each row of SCRs 400 includes a large number of merged SCRs 400 where adjacent SCRs 400 share common structures.

For example, referring to FIG. 9A, the wider portions of the p-type shallow wells 542-1 and 542-3 can each be used to implement shallow p-type well 130 of SCR 200, while the narrower portions of the p-type shallow wells 542-2 and 542-4 can each be used to implement shallow p-type well 134. Further, the narrower portions of the p-type shallow wells 542-1 and 542-3 can each be used to implement shallow p-type well 330 of SCR 400, while the wider portions of the p-type shallow wells 542-2 and 542-4 can each be used to implement shallow p-type well 334.

In addition, referring to FIG. 14A, n+ source region 574-1 can be used to implement n+ contact region 144, while n+ source region 574-2 can be used to implement n+ source region 152. Further, n+ source region 574-3 can be used to implement n+ source region 344, while n+ source region 574-4 can be used to implement n+ source region 352.

Referring to FIG. 15A, p+ contact region 580-1 can be used to implement p+ contact region 142, while p+ contact region 580-2 can be used to implement p+ contact region 150. Further, p+ contact region 580-3 can be used to implement p+ contact region 342, while p+ contact region 580-4 can be used to implement p+ contact region 150.

Referring to FIGS. 12A-12C and 16A-16C, gate oxide region 582-1 and gate 562-1 can be used to implement gate dielectric layer 160-1 and gate 160-2, respectively. In addition, gate oxide region 582-2 and gate 562-2 can be used to implement gate dielectric layer 162-1 and gate 162-2.

As further shown in FIGS. 17A-17C, ESD structure 596 includes a number of fingers 1710, each of which includes one racetrack-shaped p-type shallow well 542 (or two p-type shallow well strips), and one diffused region 546. The number of fingers 1710, in turn, includes a number of first fingers 1712 and a number of second fingers 1714 that alternate with the first fingers 1712 so that a second finger 1714 lies between each adjacent pair of first fingers 1712.

Each first finger 1712 has a number of positive strike structures 1720 that each correspond with positive strike structure 141 in SCR 200 (structure 1720 includes n+ source region 574-1 and p+ contact region 580-1), and a number of negative strike structures 1722 that each correspond with negative strike structure 341 in SCR 400 (structure 1722 includes n+ source region 574-3 and p+ contact region 580-3). The negative strike structures 1722 alternate with the positive strike structures 1720 so that a negative strike structure 1722 lies between each vertically adjacent pair of positive strike structures 1720 (as seen in FIG. 17A). Each first finger 1712 also has a number of transition regions 1724. Each transition region 1724 lies between and touches a positive strike structures 1720 and a negative strike structure 1722.

Each second finger 1714 has a number of common structures 1730 that each correspond with common structure 146 (structure 1730 includes n+ source region 574-2 and p+ contact region 580-2), and a number of common structures 1732 that each correspond with common structure 346 (structure 1732 includes n+ source region 574-4 and p+ contact region 580-4). The common structures 1732 alternate with the common structures 1730 so that a common structure 1732 lies between each adjacent pair of common structures 1730. Each second finger 1714 also has a number of transition regions 1734. Each transition region 1734 lies between and touches a common structure 1730 and a common structure 1732.

Figure 18A:
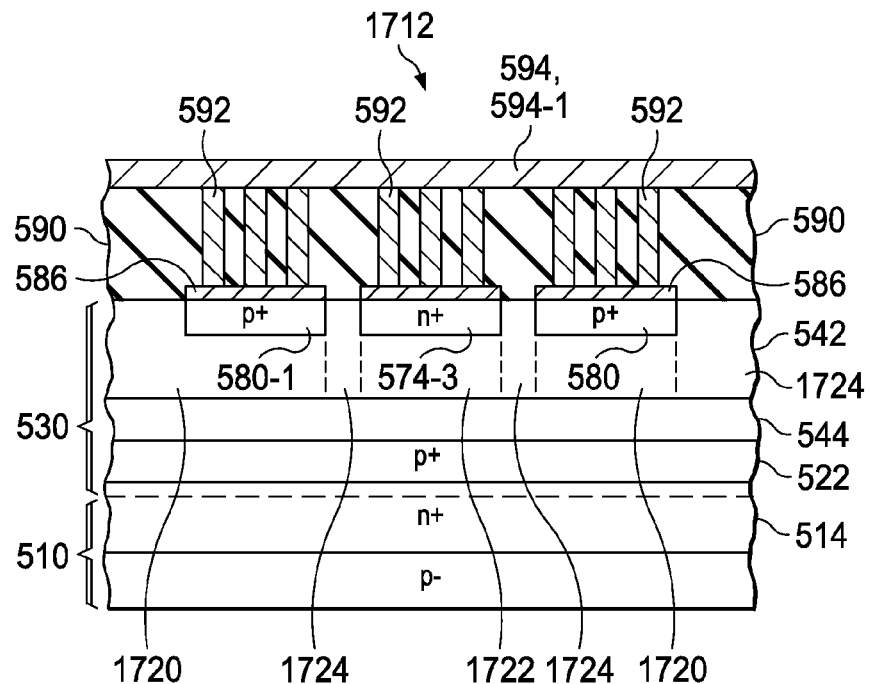
FIGS. 18A-18B are views further illustrating ESD structure 596 in accordance with the present invention.
Figure 18B:
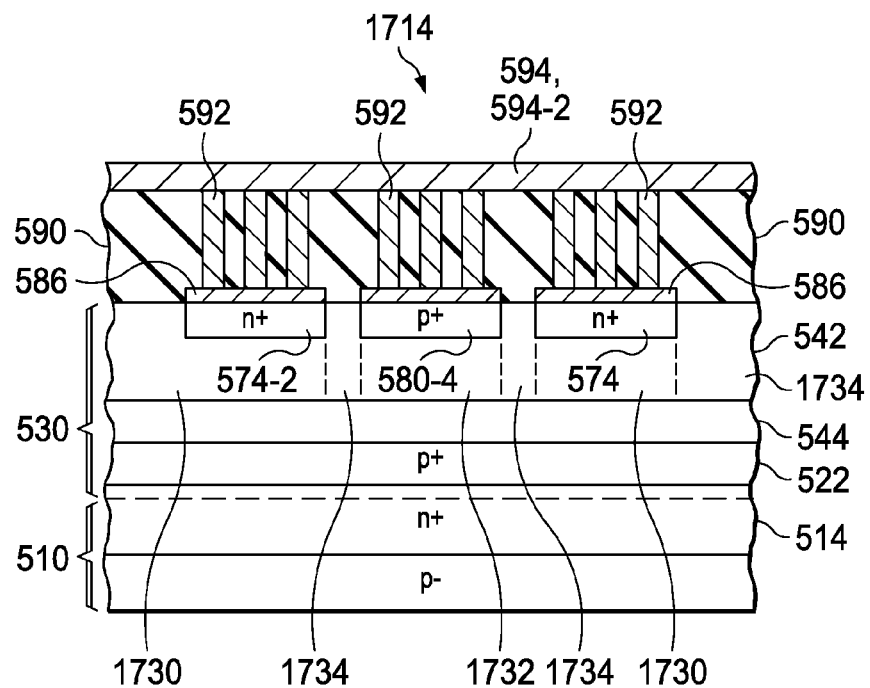

FIGS. 18A-18B show views that further illustrate ESD structure 596 in accordance with the present invention. FIG. 18A shows a cross-sectional view taken along line 18A-18A in FIG. 17A. FIG. 18B shows a cross-sectional view taken along line 18B-18B in FIG. 17A. As shown in FIGS. 18A-18B, each transition region 1724 and each transition region 1734 are silicide free regions as a result of patterned photoresist layer 584 in FIG. 16A.

As additionally shown in FIGS. 17A-17C and 18A, a single metal trace 594-1 electrically connects together all of the positive strike structures 1720 and all of the negative strike structures 1722 that lie in a single first finger 1712. Conventionally formed vias and metal-2 traces are then utilized to electrically connect a to-be-protected node to the single metal trace 594 in each first finger 1712.

As further shown in FIGS. 17A-17C and 18B, a single metal trace 594-2 electrically connects together all of the common regions 1730 and all of the common regions 1732 that lie in a single second finger 1714. Conventionally formed vias and metal-2 traces are then utilized to electrically connect a ground node to the single metal trace 594 in each second finger 1714.

Each positive strike region 1720 in a first finger 1712 and a common region 1730 in a horizontally adjacent second finger 1714 form an SCR 200. Similarly, each negative strike region 1722 in a first finger 1712 and a common region 1732 in a horizontally adjacent second finger 1714 form an SCR 400.

SCR 200 provides positive ESD strike protection, while SCR 400 provides negative ESD strike protection. Thus, each adjacent pair of SCR 200 (positive strike region 1720/common region 1730) and SCR 400 (negative strike region 1722/common region 1732) provide bidirectional ESD protection.

Further, each finger 1712 can include a large number of positive and negative strike regions 1720 and 1722, while each finger 1714 can include a large number of the common regions 1730 and 1732. As a result, ESD structure 596 has a large number of distributed bidirectional SCR pairs. (Testing indicates that ESD performance improves with increasing numbers of strike regions 1720/1722 and common regions 1730/1732.)

In operation, when the to-be-protected node experiences a positive ESD event, each of the positive strike regions 1720 in each first finger 1712 receives the positive voltage strike. Due to the operation of each SCR 200 in ESD structure 596, each of the common regions 1730 in each second finger 1714 responds to the voltage strike, and sources an ESD current to the ground node.

Each of the negative strike regions 1722 in each first finger 1712 also receives the voltage strike from a positive ESD event. The trigger voltage of each SCR 400 is set high enough so that a positive strike on the negative strike regions 1722 does not turn on any SCR 400. However, one of the advantages of the present invention is that although no SCR 400 turns on as an SCR in response to a positive ESD event, the pnp bipolar transistor regions (p-type shallow well/deep n-type region/p-type shallow well) along the edges of each SCR 400 do turn on and pass a substantial amount of the ESD current.

Similarly, when the to-be-protected node receives a negative ESD event, each of the negative strike regions 1722 in each first finger 1712 receives the voltage strike. Due to the operation of each SCR 400 in ESD structure 596, each of the common regions 1732 in each second finger 1714 responds to the voltage strike, and sinks a current from the ground node.

Each of the positive strike regions 1720 in each first finger 1712 also receives the voltage strike from a negative ESD event. The trigger voltage of each SCR 200 is set so that a negative strike on the positive strike regions 1720 does not turn on any SCR 200. However, one of the advantages of the present invention is that although no SCR 200 turns on as an SCR in response to a negative ESD event, the pnp bipolar transistor regions (p-type shallow well/deep n-type region/p-type shallow well) along the edges of each SCR 200 do turn on and pass a substantial amount of the ESD current.

Thus, a positive strike SCR, a negative strike SCR, and an ESD structure that utilizes both the positive strike and negative strike SCRs to provide bidirectional ESD protection, along with the method of making, have been described.

Since the bidirectional protection is provided by different SCRs, the positive and negative trigger voltages of the different SCRs can be independently set, thereby allowing, for example, +65V and −65V bidirectional protection. In addition, the use of a large number of distributed bidirectional ESD pairs along with the current that flows along the edges of the non-triggered SCRs during an ESD event provide robust ESD protection.

It should be understood that the above descriptions are examples of the present invention, and that various alternatives of the invention described herein may be employed in practicing the invention. Thus, it is intended that the following claims define the scope of the invention and that structures and methods within the scope of these claims and their equivalents be covered thereby.

What is claimed is:

1. A method of forming an electrostatic discharge (ESD) structure comprising:
   forming first and second wells each having a first conductivity type, the first and second wells separated by a deep region having a second conductivity type;
   forming first and second source regions in the first and second wells respectively, the first and second source regions each having the second conductivity type;
   forming a first contact region in the first well and laterally surrounding and abutting the first source region, the first contact region having the first conductivity type; and
   forming a second contact region in the second well and laterally surrounded by the second source region, the second contact region having the first_conductivity type.

2. The method of claim 1, further comprising:
   forming a first well diffusion region directly under the first source region; and
   forming a second well diffusion region directly under the second contact region.

3. The method of claim 1, further comprising:
   forming a drain well in the deep region and between the first and second wells, the drain well having the second conductivity type.

4. The method of claim 1, further comprising:
   forming a shallow trench structure between the first and second source regions.

5. The method of claim 1, further comprising:
   forming a first gate structure above the first contact region, the first contact region positioned between the first gate structure and the first source region; and
   forming a second gate structure above the second source region, the second source region positioned between the second gate structure and the second contact region.

* * * * *